(12) United States Patent
Kitamura et al.

(10) Patent No.: US 9,158,139 B2
(45) Date of Patent: Oct. 13, 2015

(54) METHOD FOR MANUFACTURING MACH-ZEHNDER MODULATOR, METHOD FOR MANUFACTURING OPTICAL WAVEGUIDE, AND OPTICAL WAVEGUIDE

(71) Applicant: SUMITOMO ELECTRIC INDUSTRIES, LTD., Osaka (JP)

(72) Inventors: Takamitsu Kitamura, Fujisawa (JP); Hideki Yagi, Machida (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/242,379

(22) Filed: Apr. 1, 2014

(65) Prior Publication Data
US 2014/0291717 A1 Oct. 2, 2014

(30) Foreign Application Priority Data
Apr. 2, 2013 (JP) .................................. 2013-076996

(51) Int. Cl.
*G02F 1/025* (2006.01)
*G02F 1/017* (2006.01)
*H01L 31/18* (2006.01)

(52) U.S. Cl.
CPC ............ *G02F 1/025* (2013.01); *G02F 1/01716* (2013.01); *H01L 31/18* (2013.01)

(58) Field of Classification Search
None
See application file for complete search history.

(56) References Cited

U.S. PATENT DOCUMENTS 5,182,228 A * 1/1993 Sekii et al. ...................... 438/39

OTHER PUBLICATIONS

K. Tsuzuki, et al., "40 Gbit/s n—i—n InP Mach-Zehnder modulator with a π voltage of 2.2 V", Electronics Letters, $2^{nd}$ Oct. 2003, vol. 39, No. 20.

* cited by examiner

*Primary Examiner* — Daniel Whalen
*Assistant Examiner* — Aneta Cieslewicz
(74) *Attorney, Agent, or Firm* — Smith, Gambrell & Russell LLP

(57) ABSTRACT

A method for manufacturing a Mach-Zehnder modulator includes the steps of forming a stacked semiconductor layer, the stacked semiconductor layer including a first conductivity type semiconductor layer, a core layer and a second conductivity type semiconductor layer, forming a waveguide mesa, the waveguide mesa having a first portion, a second portion and a third portion arranged between the first and second portions; forming a buried region on the waveguide mesa; forming an opening in the buried region on the third portion by etching the buried region using a mask; etching the second conductivity type semiconductor layer in the third portion through the buried region as a mask; and removing the buried region after etching the second conductivity type semiconductor layer. In the step of etching the second conductivity type semiconductor layer, the buried region covers a side surface of the third portion of the waveguide mesa.

8 Claims, 15 Drawing Sheets

FIG. 8A
FIG. 8B
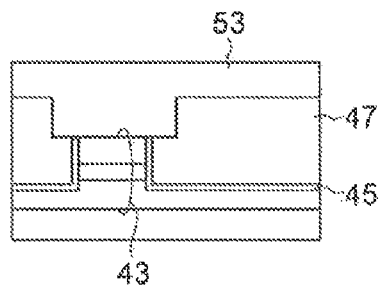
FIG. 8C
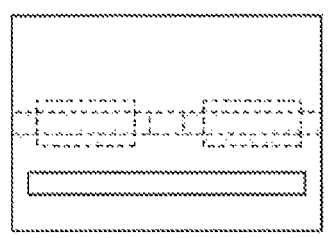
FIG. 8D
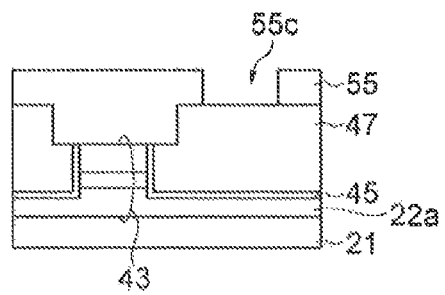
FIG. 8E
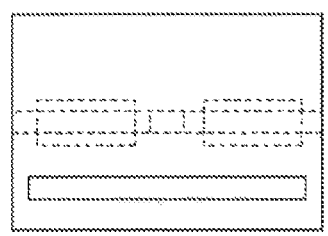
FIG. 8F
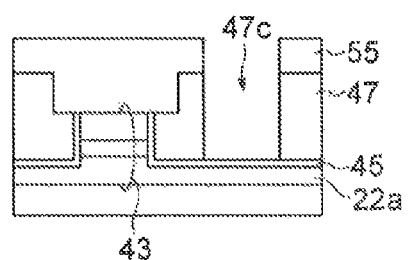
FIG. 8G
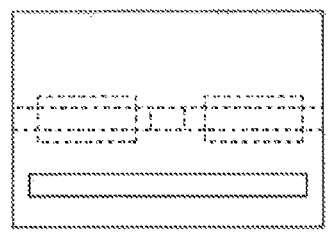
FIG. 8H
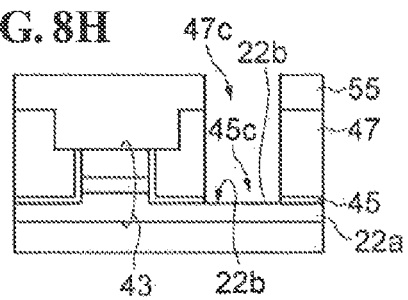

FIG. 10A
FIG. 10B
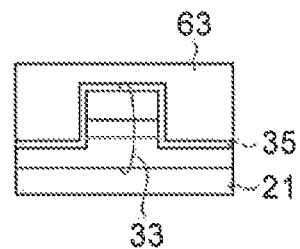
FIG. 10C
FIG. 10D
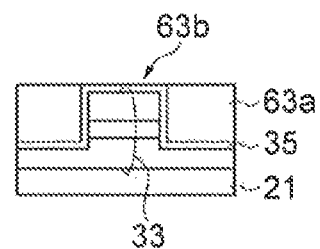
FIG. 10E
FIG. 10F
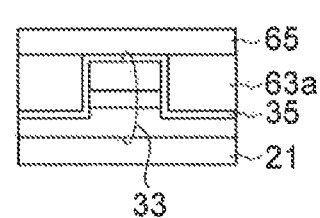

METHOD FOR MANUFACTURING MACH-ZEHNDER MODULATOR, METHOD FOR MANUFACTURING OPTICAL WAVEGUIDE, AND OPTICAL WAVEGUIDE

BACKGROUND OF THE INVENTION

1. Field of the Invention

The present invention relates to a method for manufacturing a Mach-Zehnder modulator, a method for manufacturing an optical waveguide, and an optical waveguides.

2. Description of the Related Art

K. Tsuzuki, T. Ishibashi, T. Ito, S. Oku, Y. Shibata, R. Iga, Y. Kondo and Y. Tohmori, "40 Gbit/s n-i-n InP Mach-Zehnder modulator with a π voltage of 2.2 V", Electronics Letters Online, 2 Oct. 2003, Vol. 39, No. 20. discloses a Mach-Zehnder modulator. This Mach-Zehnder modulator includes a high-mesa waveguide disposed on a semiconductor substrate. Side surfaces of the high-mesa waveguide are buried with a benzocyclobutene resin.

SUMMARY OF THE INVENTION

Mach-Zehnder modulators have optical waveguides for generating optical signals which are modulated in accordance with high-frequency electric signals. An RF electrode and a DC electrode are disposed on the optical waveguide. The RF electrode is used to supply a high-frequency electric signal to the optical waveguide. The DC electrode is used, for example, to control the phase of light propagating in the optical waveguide or to control the operating point of the modulator. These electrodes are disposed on different portions of the optical waveguide, respectively. The DC bias is applied from the DC electrode to one portion of the optical waveguide. The electric field resulting from the DC bias leaks into another portion of the optical waveguide in which input light is modulated in response to a high-frequency electric signal supplied via the RF electrode. This leakage of the electric field affects the modulation bandwidth of the Mach-Zehnder modulator. To avoid influences due to such leakage, it is necessary to electrically isolate the optical waveguide portion operating in response to an electric signal from the RF electrode from the optical waveguide portion operating in response to a voltage from the DC electrode.

Isolation may be established by disposing an isolating waveguide portion between the optical waveguide portion operating in response to an electric signal from the RF electrode and the optical waveguide portion operating in response to a voltage from the DC electrode. In this isolating waveguide portion, an upper cladding layer disposed on a core layer is removed by etching. An optical waveguide including the isolating waveguide portion without an upper cladding layer may be manufactured by any of the following two approaches. The first is to remove the semiconductor portion for the upper cladding layer prior to the manufacturing of the waveguide mesa. The second is to remove part of the upper cladding layer after the waveguide is manufactured.

In the first approach, the waveguide is manufactured after the upper cladding layer is removed. Accordingly, the removal of the semiconductor layer defining the upper cladding layer produces an unevenness or step on the surface of the epitaxial wafer. This unevenness or step hinders the afterward formation of a pattern of the waveguide using, for example, a photolithography method, resulting in a deterioration in the accuracy of pattern alignment. Further, in the process of the pattern alignment, simultaneous focusing on the upper and lower levels at the elevation change on the wafer is infeasible. This causes a change in shape or size of the pattern at the location of the unevenness in a resist mask. If the semiconductor layers are etched using this resist mask to form a waveguide, the width of the waveguide will be varied at the location of the unevenness, resulting in increasing a loss of light propagating in the optical waveguide.

On the other hand, in the second approach of removing the upper cladding layer after the fabrication of the waveguide, change of the width of the waveguide does not occur. However, in the second approach of removing the upper cladding layer, the following manufacturing defect occurs. The upper cladding layer of the waveguide mesa is removed by, for example, wet etching through a mask including a pattern having an opening across the waveguide mesa. However, the lower cladding layer of the waveguide mesa frequently is composed of the same material as that of the upper cladding layer. Thus, when the upper cladding layer is etched by wet etching, the lower cladding layer exposed in the opening across the waveguide mesa is also etched. In addition, when the upper cladding layer of the waveguide mesa is removed by, for example, dry etching, not only the top surface but also the side surfaces of the waveguide mesa exposed in the opening across the waveguide mesa are etched. As a result, the width of the waveguide is reduced.

A method for manufacturing a Mach-Zehnder modulator according to the present invention includes the steps of (a) forming a stacked semiconductor layer on a substrate, the stacked semiconductor layer including a first conductivity type semiconductor layer, a core layer and a second conductivity type semiconductor layer; (b) forming a waveguide mesa by etching the stacked semiconductor layer, the waveguide mesa having a first portion, a second portion and a third portion arranged between the first and second portions, the waveguide mesa extending in a direction of a waveguide axis; (c) forming a first buried region on a top surface and a side surface of the waveguide mesa and on the substrate; (d) forming a mask on the first buried region, the mask having an opening on the third portion of the waveguide mesa; (e) forming an opening in the first buried region by etching the first buried region using the mask to expose a top surface of the third portion of the waveguide mesa through the opening in the first buried region; (f) after removing the mask, etching the second conductivity type semiconductor layer in the third portion of the waveguide mesa through the first buried region as a mask; and (g) removing the first buried region after etching the second conductivity type semiconductor layer. In the step of forming the opening in the first buried region, the first buried region covers a side surface of the third portion of the waveguide mesa.

According to the method for manufacturing a Mach-Zehnder modulator, an opening is formed in the first buried region on the third portion of the waveguide mesa with use of the mask having an opening on the third portion of the waveguide mesa. During this process, the first buried region covers the side surfaces of the third portion of the waveguide mesa, and thus can protect the side surfaces of the third portion of the waveguide mesa. After the opening is formed in the first buried region, the second conductivity type semiconductor layer in the third portion of the waveguide mesa is selectively etched while using the first buried region as a mask. During this etching, the first conductivity type semiconductor layer is not exposed to the etchant. Through these steps, a waveguide mesa having an isolation region in the third portion is manufactured.

The method for manufacturing a Mach-Zehnder modulator according to the present invention may further include the steps of, after forming the waveguide mesa, forming an insulating layer on the top surface and the side surface of the waveguide mesa and on the substrate; and, after forming the opening in the first buried region, forming an opening in the insulating layer on the third portion of the waveguide mesa by etching the insulating layer through the mask to form an insulating mask from the insulating layer. The second conductivity type semiconductor layer is preferably etched through the insulating mask after removing the mask. In the step of forming the insulating mask, the first buried region covers the side surface of the third portion of the waveguide mesa. The first buried region is made of a material different from a material of the insulating layer.

According to the method for manufacturing a Mach-Zehnder modulator, the insulating layer is formed on the substrate after the formation of the waveguide mesa so as to cover the top surface and the side surfaces of the waveguide mesa. Further, after the formation of the opening in the first buried region on the third portion of the waveguide mesa, an opening is formed in the insulating layer on the third portion of the waveguide mesa through the mask, and thereby the insulating layer is fabricated into an insulating mask. During the fabrication of the insulating mask, the first buried region covers the side surfaces of the third portion of the waveguide mesa. With this configuration, in forming the insulating mask, the insulating layer on the side surfaces of the third portion of the waveguide mesa is protected with the first buried region. Further, the insulating layer on the top surface of the third portion of the waveguide mesa is selectively etched. By the use of the thus-fabricated insulating mask, the second conductivity type semiconductor layer in the third portion of the waveguide mesa is etched selectively. During this etching, the first conductivity type semiconductor layer is not exposed to the etchant. Through these steps, a waveguide mesa having an isolation region in the third portion is manufactured.

The method for manufacturing a Mach-Zehnder modulator according to the present invention may further include the steps of, after removing the first buried region, forming a second buried region on the top surface and the side surface of the waveguide mesa and on the substrate; forming a first electrode opening in the second buried region on the first portion of the waveguide mesa; forming a second electrode opening in the second buried region on the second portion of the waveguide mesa; forming a first electrode in the first electrode opening, the first electrode being electrically connected to a top surface of the first portion of the waveguide mesa through the first electrode opening; and forming a second electrode in the second electrode opening, the second electrode being electrically connected to a top surface of the second portion of the waveguide mesa through the second electrode opening. According to the method for manufacturing a Mach-Zehnder modulator, the second electrode is electrically isolated from the first electrode because the isolation structure is formed in the waveguide mesa. Specifically, the third portion constituting the isolation structure is formed between the first portion and the second portion.

In the method for manufacturing a Mach-Zehnder modulator according to the present invention, the first buried region may be made of spin-on-glass. The mask may be made of resist. In addition, the opening of the mask may have a width larger than a width of the third portion of the waveguide mesa. According to the method for manufacturing a Mach-Zehnder modulator, the first buried region is made of spin-on-glass (SOG). Therefore, the first buried region is easily removed after etching the second conductivity type semiconductor layer.

In the method for manufacturing a Mach-Zehnder modulator according to the present invention, preferably, the step of forming the first buried region includes a step of applying a resist onto the top surface and the side surfaces of the waveguide mesa, and a step of baking the resist to form a cured resist. The first buried region includes the cured resist. The mask is made of resist. In addition, the opening of the mask has a width larger than a width of the third portion of the waveguide mesa. According to the method for manufacturing a Mach-Zehnder modulator, the first buried region includes the cured resist. The cured resist is resistant to the developer used in the step of forming the mask made of resist on the first buried region of the cured resist.

A method for manufacturing a Mach-Zehnder modulator according to the present invention includes the steps of (a) forming a stacked semiconductor layer on a substrate, the stacked semiconductor layer including a first conductivity type semiconductor layer, a core layer and a second conductivity type semiconductor layer; (b) forming a waveguide mesa by etching the stacked semiconductor layer, the waveguide mesa having a first portion, a second portion and a third portion arranged between the first and second portions, the waveguide mesa extending in a direction of a waveguide axis; (c) forming a first buried region on a top surface and a side surface of the waveguide mesa and on the substrate, the first buried region including an insulating layer made of a dielectric material; (d) forming a mask on the first buried region, the mask having an opening on the third portion of the waveguide mesa; (e) forming an insulating mask by etching the first buried region using the mask, the insulating mask having an opening on the third portion of the waveguide mesa; (f) after removing the mask, etching the second conductivity type semiconductor layer in the third portion of the waveguide mesa through the insulating mask; and (g) removing the insulating mask after the etching the second conductivity type semiconductor layer. In the step of forming an insulating mask, the first buried region covers a side surface of the third portion of the waveguide mesa. In addition, in the step of etching the second conductivity type semiconductor layer, the insulating mask covers the side surface of the third portion of the waveguide mesa.

According to the method for manufacturing a Mach-Zehnder modulator, an opening is formed in the first buried region on the third portion of the waveguide mesa with use of the mask having an opening on the third portion of the waveguide mesa, and thereby the first buried region is fabricated into an insulating mask. During the fabrication of the insulating mask, the first buried region covers the side surfaces of the third portion of the waveguide mesa. Thus, the side surfaces of the third portion of the waveguide mesa can be protected with the insulating mask. Further, the insulating layer on the top surface of the third portion of the waveguide mesa is etched selectively. With the use of the insulating mask fabricated in the above manner, the second conductivity type semiconductor layer in the third portion of the waveguide mesa is selectively etched. During this etching, the first buried region (the insulating mask) protects the first conductivity type semiconductor layer from being exposed to the etchant. Through these steps, a waveguide mesa having an isolation region in the third portion is manufactured.

In the method for manufacturing a Mach-Zehnder modulator according to the present invention, preferably, the insulating layer includes a silicon dioxide film. The step of forming the first buried region includes a step of forming the silicon dioxide film on the top surface and the side surface of the waveguide mesa and on the substrate and a step of planarizing the silicon dioxide film.

According to the method for manufacturing a Mach-Zehnder modulator, the silicon dioxide film that buries the top surface and the side surfaces of the waveguide mesa is planarized to form the first buried region, and thereafter an opening is formed in the first buried region on the third portion of the waveguide mesa. Through these steps, the opening is formed in the first buried region on the third portion of the waveguide mesa while protecting the side surfaces of the first conductivity type semiconductor layer in the third portion of the waveguide mesa.

A method for manufacturing an optical waveguide according to the present invention includes the steps of (a) forming stacked semiconductor layers on a substrate, the stacked semiconductor layers including a first conductivity type semiconductor layer, a core layer and a second conductivity type semiconductor layer, (b) forming a waveguide mesa by etching the stacked semiconductor layer, the waveguide mesa having a first portion, a second portion and a third portion arranged between the first and second portions, the waveguide mesa extending in a direction of a waveguide axis; (c) forming an insulating layer on the top surface and the side surface of the waveguide mesa and on the substrate; (d) forming a first buried region on the insulating layer formed on the top surface and the side surface of the waveguide mesa and on the substrate, the first buried region including a material different from a material of the insulating layer; (e) forming a mask on the first buried region, the mask having an opening on the third portion of the waveguide mesa; (f) forming an insulating mask by etching the first buried region and the insulating layer using the mask, the insulating mask having an opening on the third portion of the waveguide mesa; (g) after removing the mask, etching the second conductivity type semiconductor layer in the third portion of the waveguide mesa through the insulating mask; and (h) removing the insulating mask after etching the second conductivity type semiconductor layer. In the step of forming the insulating mask, the first buried region covers a side surface of the third portion of the waveguide mesa. In addition, in the step of etching the second conductivity type semiconductor layer, the insulating mask covers the side surface of the third portion of the waveguide mesa.

According to the method for manufacturing an optical waveguide, an opening is formed in the first buried region on the third portion of the waveguide mesa with use of the mask having an opening on the third portion of the waveguide mesa, and thereby the insulating mask is fabricated from the first buried region. During the fabrication of the insulating mask, the first buried region covers the side surfaces of the third portion of the waveguide mesa. Thus, the side surfaces of the third portion of the waveguide mesa can be protected with the first buried region, and the first buried region on the top surface of the third portion of the waveguide mesa is etched selectively. With the use of the insulating mask fabricated in the above manner, the second conductivity type semiconductor layer in the third portion of the waveguide mesa is selectively etched. During this etching, the first buried region (the insulating mask) serves as a protective film that prevents the first conductivity type semiconductor layer from being exposed to the etchant. Through these steps, a waveguide mesa having an isolation region in the third portion is manufactured.

An optical waveguide according to the present invention includes a waveguide mesa having a first portion, a second portion and a third portion arranged between the first and second portions, the waveguide mesa extending in a direction of a waveguide axis; a buried region disposed on the top surface and the side surface of the waveguide mesa; a first electrode opening in the buried region on the first portion of the waveguide mesa; a second electrode opening in the buried region on the second portion of the waveguide mesa; a first electrode in the first electrode opening, the first electrode being electrically connected to a top surface of the first portion of the waveguide mesa through the first electrode opening; and a second electrode in the second electrode opening, the second electrode being electrically connected to a top surface of the second portion of the waveguide mesa through the second electrode opening. The first portion and the second portion of the waveguide mesa include a first conductivity type semiconductor layer, an i-type core layer and a second conductivity type semiconductor layer stacked sequentially on a substrate. The third portion of the waveguide mesa includes the first conductivity type semiconductor layer and the core layer stacked sequentially on the substrate. The third portion of the waveguide mesa does not include the second conductivity type semiconductor layer on the core layer. The second conductivity type semiconductor layers in the first portion and the second portion of the waveguide mesa are physically and electrically isolated from each other. In addition, the first conductivity type semiconductor layer and the core layer in the waveguide mesa have a side surface extending continuously in the direction of the waveguide axis from the first portion to the second portion of the waveguide mesa. Furthermore, the buried region may be formed of a benzocyclobutene (BCB) resin.

In the optical waveguide, the side surfaces of the first conductivity type semiconductor layer in the third portion of the waveguide mesa do not have a substantial change in elevation at the boundary between the first conductivity type semiconductor layer and the core layer, and are connected continuously to the side surfaces of the i-type core layer in the third portion of the waveguide mesa. The side surfaces of the first conductivity type semiconductor layer do not have any elevation changes in the vicinity of the boundary between the first portion and the third portion of the waveguide mesa as well as in the vicinity of the boundary between the second portion and the third portion of the waveguide mesa.

BRIEF DESCRIPTION OF THE DRAWINGS

FIGS. 8A to 8H schematically illustrate primary steps in a Mach-Zehnder modulator manufacturing method and an insulated optical waveguide manufacturing method according to the first embodiment.

FIGS. 10A to 10F schematically illustrate primary steps in a Mach-Zehnder modulator manufacturing method and an insulated optical waveguide manufacturing method according to a second embodiment.

DESCRIPTION OF THE PREFERRED EMBODIMENTS

A method for manufacturing a Mach-Zehnder modulator, a method for manufacturing an optical waveguide, and an optical waveguide according to the present invention will be described with reference to the attached drawings. Where possible, the same reference signs will be used for identical features.

Figure 1:
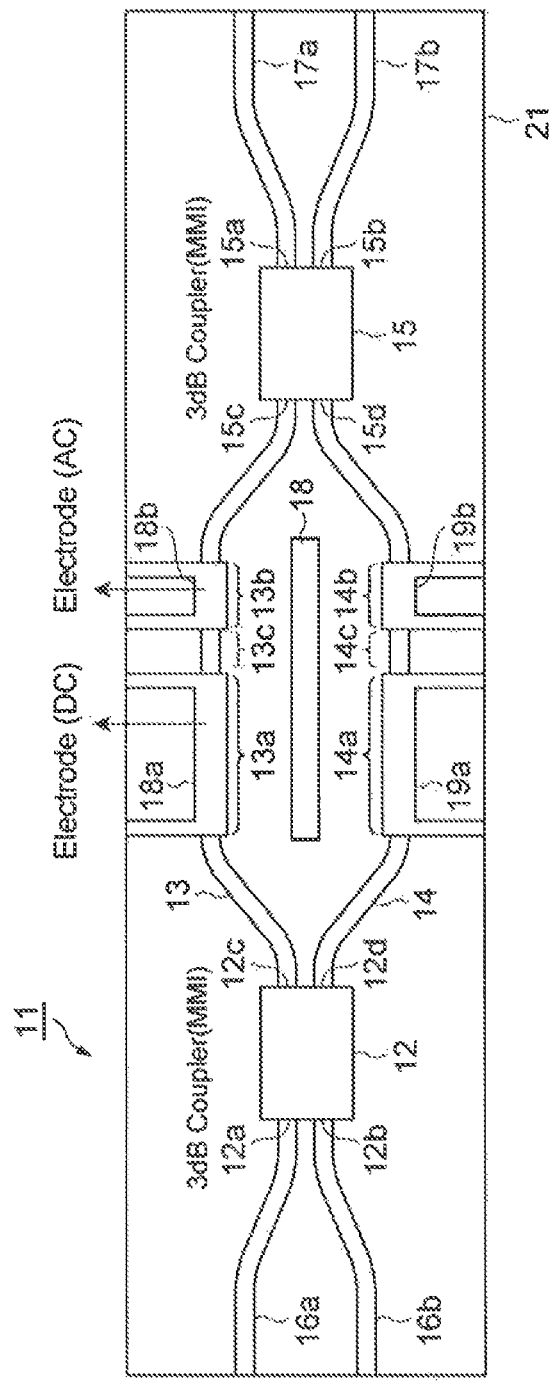
FIG. 1 is a plan view illustrating a Mach-Zehnder modulator according to an embodiment.

First, a Mach-Zehnder modulator 11 illustrated in FIG. 1 will be described. The Mach-Zehnder modulator 11 includes a first optical coupler 12, a first arm waveguide 13, a second arm waveguide 14 and a second optical coupler 15. The first optical coupler 12 has a first port 12a and a second port 12b optically connected to a waveguide 16a and a waveguide 16b, respectively, as well as has a third port 12c and a fourth port 12d optically connected to the first arm waveguide 13 and the second arm waveguide 14, respectively. The second optical coupler 15 has a first port 15a and a second port 15b optically connected to a waveguide 17a and a waveguide 17b, respectively, as well as has a third port 15c and a fourth port 15d optically connected to the first arm waveguide 13 and the second arm waveguide 14, respectively. An n-side electrode 18 is disposed between the first arm waveguide 13 and the second arm waveguide 14. A first p-side electrode (DC electrode) and a second p-side electrode (AC electrode) are disposed on the first arm waveguide 13. The first p-side electrode (DC electrode) is connected to a first portion 13a of the first arm waveguide 13. The second p-side electrode (AC electrode) is connected to a second portion 13b of the first arm waveguide 13. A third portion 13c of the first arm waveguide 13 is disposed between the first portion 13a of the first arm waveguide 13 and the second portion 13b of the first arm waveguide 13. The third portion 13c isolates an upper cladding layer of the first portion 13a from an upper cladding layer of the second portion 13b. The optical waveguides constituting the Mach-Zehnder modulator 11 include a lower cladding layer, an i-type core layer and an upper cladding layer sequentially disposed on a substrate. Specifically, the first portion 13a and the second portion 13b of the first arm waveguide 13 include a lower cladding layer, an i-type core layer and an upper cladding layer, whilst the third portion 13c includes the lower cladding layer and the i-type core layer. Because of the absence of the upper cladding layer in the third portion 13c, the first portion 13a and the second portion 13b are electrically isolated from each other. The second arm waveguide 14 has a similar structure to the first arm waveguide 13.

First Embodiment

Next, a method for manufacturing a Mach-Zehnder modulator and a method for manufacturing an optical waveguide will be described with reference to FIGS. 2A to 9I.

Figure 2A:
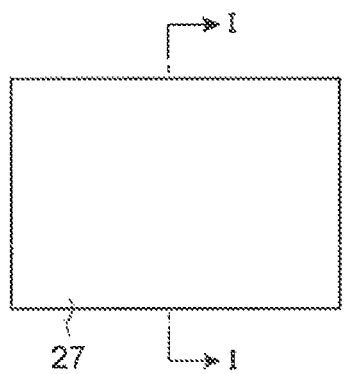
FIGS. 2A to 2H schematically illustrate primary steps in a Mach-Zehnder modulator manufacturing method and an insulated optical waveguide manufacturing method according to a first embodiment.
Figure 2B:
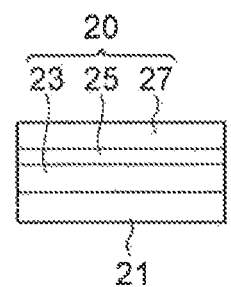

As illustrated in FIGS. 2A and 2B, a stacked semiconductor layer 20 is formed on a substrate 21. The stacked semiconductor layer 20 includes a first cladding layer 23, a core layer 25 and a second cladding layer 27 that are sequentially grown on the substrate 21 by a metal-organic vapor phase epitaxy (MOVPE) method. FIGS. 2A, 2C, 2E and 2G are plan views. FIGS. 2B, 2D, 2F and 2H are sectional views taken along the line I-I in FIG. 2A. The substrate 21 is made of a III-V group compound semiconductor such as InP. Preferably, the substrate 21 is made of semi-insulating semiconductor such as Fe-doped InP. The first cladding layer 23 includes a first conductivity type semiconductor, and is, for example, an n-type InP layer (thickness 1.5 μm). The core layer 25 includes an i-type semiconductor. For example, the core layer 25 is composed of a multi quantum well (MQW) structure in which AlGaInAs well layers (thickness 12 nm) and AlInAs barrier layers (thickness 8 nm) are stacked alternately. The second cladding layer 27 includes a second conductivity type semiconductor, and is, for example, a p-type InP layer (thickness 1.3 μm).

Figure 2C:
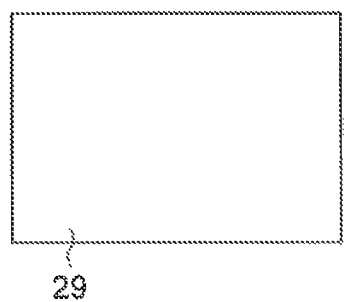
Figure 2D:
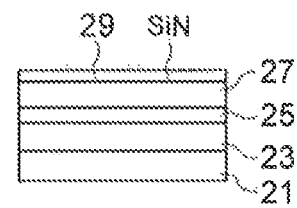
Figure 2E:
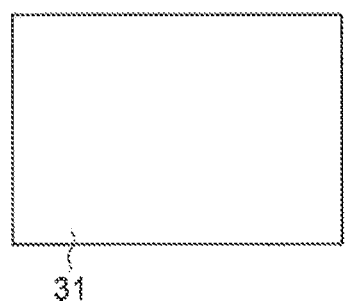
Figure 2F:
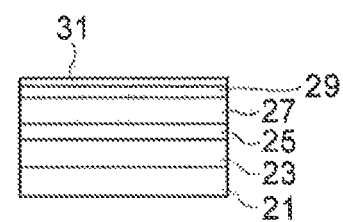
Figure 2G:
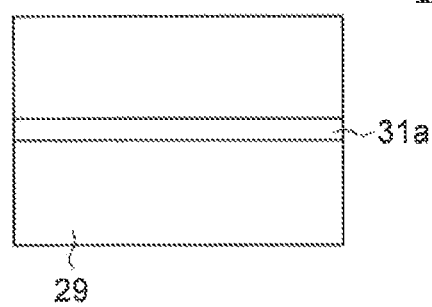
Figure 2H:
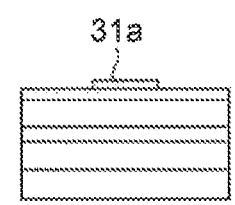

Next, waveguide mesa structures that constitute the first arm waveguide 13 and the second arm waveguide 14 are formed. As illustrated in FIGS. 2C and 2D, an insulating layer 29 is formed on the stacked semiconductor layer 20. The insulating layer 29 is made of a dielectric material such as $SiO_2$, SiON, or SiN. The insulating layer 29 is formed by a chemical vapor deposition (CVD) method, for example. Thereafter, as illustrated in FIGS. 2E and 2F, a resist 31 is applied on the insulating layer 29. For example, the resist 31 is formed on the entire surface of the insulating layer 29 by a spin coating method. A resist mask 31a which has a pattern for forming the waveguide of the Mach-Zehnder modulator is formed by photolithography, as illustrated in FIGS. 2G and 2H.

Figure 3A:
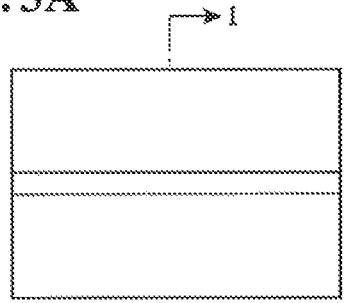
FIGS. 3A to 3J schematically illustrate primary steps in a Mach-Zehnder modulator manufacturing method and an insulated optical waveguide manufacturing method according to the first embodiment.
Figure 3B:
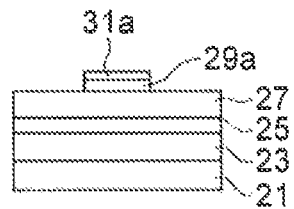
Figure 3C:
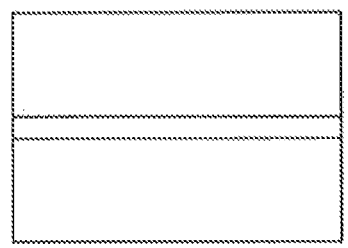
Figure 3D:
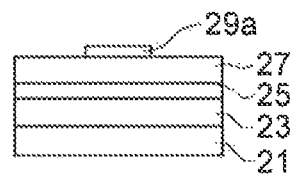
Figure 3E:
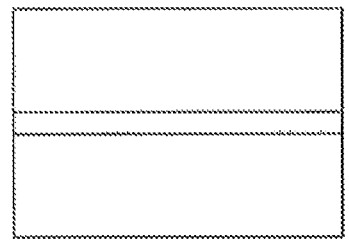
Figure 3F:
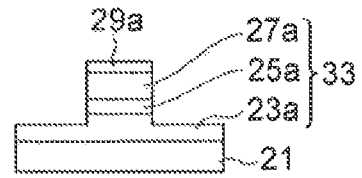
Figure 3G:
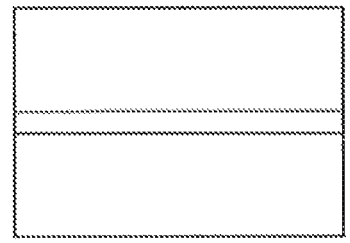
Figure 3H:
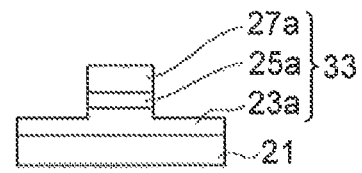

As illustrated in FIGS. 3A and 3B, the insulating layer 29 is etched through the resist mask 31a, thereby transferring the resist pattern to the insulating layer. In this manner, a mask 29a is formed. Thereafter, as illustrated in FIGS. 3C and 3D, the resist mask 31a is removed by washing with an organic solvent and oxygen ($O_2$) plasma ashing. Next, as illustrated in FIGS. 3E and 3F, the stacked semiconductor layer 20 is etched through the mask 29a to form a waveguide mesa 33 by, for example, a reactive ion etching (RIE) method. The waveguide mesa 33 extends in a direction of a waveguide axis. In the RIE process, hydrogen chloride (HCl) gas or hydrogen iodide (HI) gas is used as the etching gas. In the formation of the waveguide mesa 33, the second cladding layer 27, the core layer 25 and a portion of the first cladding layer 23 are etched by the dry etching method with the mask 29a. As a result of this etching, the waveguide mesa 33 including a second cladding layer 27a, a core layer 25a and a first cladding layer 23a is formed on the substrate 21. Subsequently, as illustrated in FIGS. 3G and 3H, the mask 29a is removed by, for example, wet etching with buffered hydrofluoric acid (BHF).

Next, where necessary, a mesa structure for isolating elements (element-isolating mesa) is formed. A portion of the first cladding layer 23a which is exposed on the substrate 21 by etching the stacked semiconductor layer 20 is etched to form a first cladding layer 22a. As a result of this, the semi-insulating InP substrate is exposed. The principal surface of the substrate 21 then has a portion covered with the first cladding layer 22a on which the waveguide mesa 33 is formed, and a portion defined by the surface of the semi-insulating InP substrate. Specifically, first, an insulating layer is formed for use as an etching mask on the substrate 21 on which the waveguide mesa 33 has been formed. For example, this insulating layer is made of a dielectric material such as $SiO_2$, SiON, or SiN. Next, a resist mask having a pattern for forming the element-isolating mesa structure is formed on the insulating layer. Through this resist mask, the insulating layer is etched by, for example, a RIE method with $CF_4$ gas to form an insulating mask. Thereafter, the resist layer is removed by washing with an organic solvent and oxygen ($O_2$) plasma ashing. While using this insulating mask as the etching mask, portions of the first cladding layer 23a on the substrate 21 are etched by, for example, a RIE method. In this manner, an island-shaped element-isolating mesa structure is formed. The element-isolating mesa structure includes the first cladding layer 22a on which the waveguide mesa 33 is formed. Then, the insulating mask is removed with BHF.

Next, an insulating layer 35 is formed on the substrate 21 having the waveguide mesa 33 so as to cover the waveguide mesa 33. For example, the insulating layer 35 is made of a dielectric material such as $SiO_2$, SiN or SiON. In the embodiment, the insulating layer 35 is made of SiON.

Figure 4A:
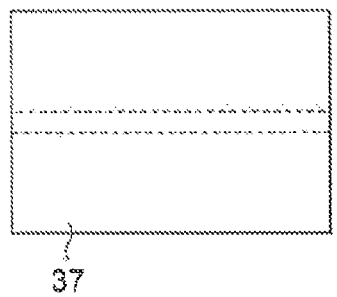
FIGS. 4A to 4H schematically illustrate primary steps in a Mach-Zehnder modulator manufacturing method and an insulated optical waveguide manufacturing method according to the first embodiment.
Figure 4B:
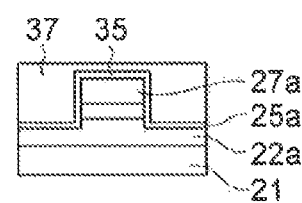

After the insulating layer 35 is formed, as illustrated in FIGS. 4A and 4B, a dummy buried region (also referred to as a masking buried region) 37 is formed on a top surface and a side surface of the waveguide mesa 33 covered with the insulating layer 35 to bury the waveguide mesa 33. In the embodiment, the dummy buried region (masking buried region) 37 serves as a first buried region. In this embodiment, the dummy buried region 37 is composed of, for example, spin-on-glass (SOG). By embedding the waveguide mesa 33 in the dummy buried region 37 of SOG, a top surface of the dummy buried region 37 is planarized. Therefore, the dummy buried region 37 has a flat surface. In this embodiment, the dummy buried region 37 is formed by applying SOG and baking the SOG (for example, at 100° C. for 2 minutes and at 200° C. for 2 minutes). Further, the SOG is subjected to a curing process (for example, at 300° C. for 2 minutes).

Next, an isolation structure to separate two portions of the waveguide electrically and physically is manufactured. An example will be discussed based on the Mach-Zehnder modulator 11 illustrated in FIG. 1. In the following description, the waveguide mesa 33 refers to the first arm waveguide 13. The second arm waveguide 14 has a similar structure as the first arm waveguide 13, and thus the description thereof will be omitted. As already described, the waveguide mesa 33 is configured such that a first portion (the first portion 13a in FIG. 1) and a second portion (the second portion 13b in FIG. 1) are electrically isolated from each other by a third portion (the third portion 13c in FIG. 1) disposed between the first portion (the first portion 13a in FIG. 1) and the second portion (the second portion 13b in FIG. 1). The third portion (the third portion 13c in FIG. 1) allows these portions to be isolated from each other.

Figure 4C:
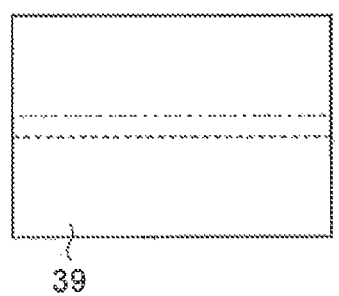
Figure 4D:
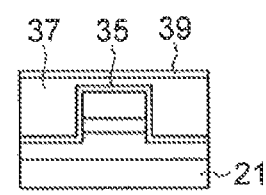
Figure 4E:
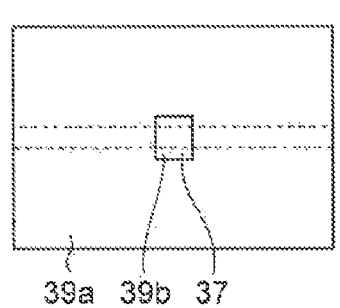
Figure 4F:
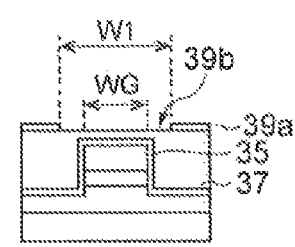

Such a third portion is produced in the waveguide mesa 33. First, steps are performed to expose the top surface of the waveguide mesa 33. As illustrated in FIGS. 4C and 4D, a resist 39 for forming a mask is applied on the substrate 21 and the top surface and side surface of the waveguide mesa 33 to cover the waveguide mesa 33 in a manner similar to that described above. As illustrated in FIGS. 4E and 4F, a resist mask 39a is formed on the flat surface of the dummy buried region 37. This resist mask 39a has an opening 39b above the third portion of the waveguide mesa 33. The width W1 of the opening 39b is larger than the width WG of the waveguide mesa 33. The waveguide mesa 33 is buried with SOG, and the surface of the SOG has been planarized. As mentioned above, the resist 39 is applied on the flat surface of the dummy buried region 37. The resist 39 having a thin and uniform thickness can be used. Therefore, the resist mask 39a having a high-accuracy pattern is formed.

Figure 4G:
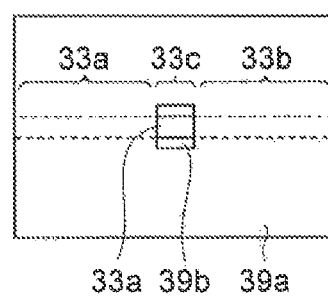
Figure 4H:
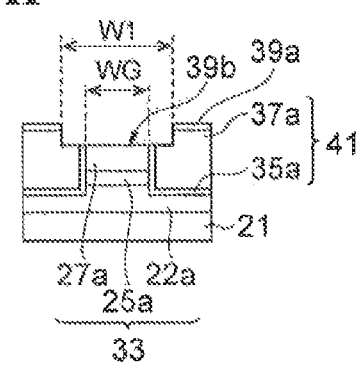

While using the resist mask 39a, the dummy buried region 37 and the insulating layer 35 are etched. Consequently, as illustrated in FIGS. 4G and 4H, an insulating mask 41 is formed. In this etching, the SOG is removed by RIE with $CF_4$ gas using the resist mask 39a to form a patterned SOG. The insulating layer 35 is exposed in the opening 39b of the resist mask 39a through the patterned SOG. Further, the insulating layer 35 made of, for example, SiON is etched using the patterned SOG as an etching mask. As a result, the insulating mask 41 is formed. In this manner, the top of the waveguide mesa 33 is selectively exposed. The insulating mask 41 includes an insulating layer 35a and a dummy buried region 37a.

Figure 5A:
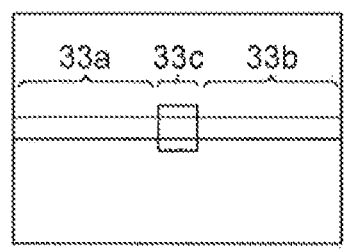
FIGS. 5A to 5H schematically illustrate primary steps in a Mach-Zehnder modulator manufacturing method and an insulated optical waveguide manufacturing method according to the first embodiment.
Figure 5B:
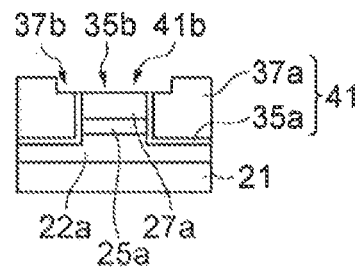

Thereafter, as illustrated in FIGS. 5A and 5B, the resist mask 39a is removed by washing with an organic solvent and oxygen ($O_2$) plasma ashing. The insulating mask 41 has an opening 41b corresponding to the opening 39b of the resist mask 39a. The insulating mask 41 covers the side surfaces and the top surfaces of a first portion 33a and a second portion 33b of the waveguide mesa 33, as well as covers the side surfaces of a third portion 33c of the waveguide mesa 33. The dummy buried region 37a has an opening 37b corresponding to the opening 39b of the resist mask 39a. The insulating layer 35a covers the side surfaces and the top surfaces of the first portion 33a and the second portion 33b of the waveguide mesa 33, as well as covers the side surfaces of the third portion 33c of the waveguide mesa 33. Further, the dummy buried region 37a covers the side surfaces and the top surfaces of the first portion 33a and the second portion 33b of the waveguide mesa 33, as well as covers the side surfaces of the third portion 33c of the waveguide mesa 33. The insulating layer 35a has an opening 35b corresponding to the opening 39b of the resist mask 39a. The opening 37b and the opening 35b are located on the third portion 33c of the waveguide mesa 33. The top surface of the waveguide mesa 33 is exposed in the opening 37b and the opening 35b.

Figure 5C:
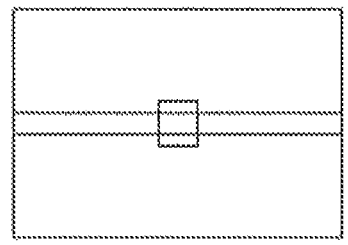
Figure 5D:
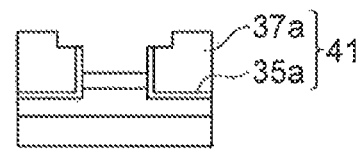

As illustrated in FIGS. 5C and 5D, the second cladding layer of the waveguide mesa 33 is etched by, for example, RIE with HCl gas or HI gas through the insulating mask 41 to expose the top surface of the core layer 25a. In this embodiment, for example, the waveguide mesa 33 is etched through the SOG and the SiON layer as the mask until the top surface of the core layer 25a is exposed. Because the insulating layer 35a has the opening 35b only on the top surface of the third portion 33c of the semiconductor waveguide mesa 33, the first cladding layer 22a and the element-isolating mesa structure located under the core layer 25a of the waveguide mesa 33 are not etched.

Figure 5E:
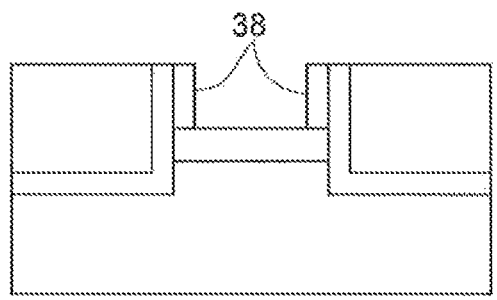
Figure 5F:
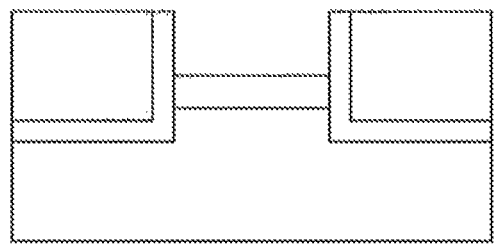

After the waveguide mesa 33 is etched using insulating mask 41, a protrusion 38 of the semiconductor layer may remain on the core layer 25a along the interface between the waveguide mesa and the dielectric film of SiON as illustrated in FIG. 5E. Where necessary, as illustrated in FIG. 5F, the protrusion 38 of the semiconductor layer is removed by etching with diluted hydrochloric acid after the etching of the waveguide mesa 33. In the step of etching the waveguide mesa 33, the semiconductor layer that is exposed in the third portion 33c of the waveguide mesa 33 is the core layer (MQW composed of AlGaInAs/AlInAs). These materials constituting the core layer are negligibly etched with diluted hydrochloric acid. Thus, the protrusion of the semiconductor layer is selectively removed by etching with diluted hydrochloric acid while the core layer exposed in the third portion 33c of the waveguide mesa 33 is not substantially etched.

Figure 5G:
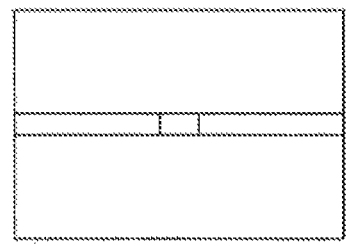
Figure 5H:
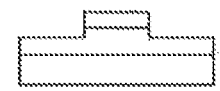

After etching the second cladding layer in the third portion of the waveguide mesa 33, the insulating mask 41 is removed as illustrated in FIGS. 5G and 5H. In this embodiment, the dummy buried region 37a and the insulating layer 35a are removed by etching. For example, this removal is performed as described below. As a result of the removal, the second cladding layer defines the uppermost layer in the first and second portions of the waveguide mesa 33, and the core layer defines the uppermost layer in the third portion of the waveguide mesa (the waveguide mesa 43 in FIG. 6A). In this third portion of the waveguide mesa, the i-type core layer is exposed as the top surface. Thus, the second cladding layer in the first portion of the waveguide mesa 33 is physically and electrically isolated from the second cladding layer in the second portion.

The dummy buried region 37a made of SOG is removed by etching with a mixed gas including $CF_4$ and $O_2$. The etching exposes the insulating layer 35a made of a dielectric film of SiON, for example. After the removal of the dummy buried region 37a, the insulating layer 35a is removed by etching with hydrofluoric acid (such as BHF).

Figure 6A:
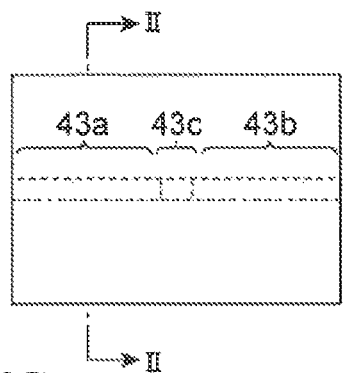
FIGS. 6A to 6F schematically illustrate primary steps in a Mach-Zehnder modulator manufacturing method and an insulated optical waveguide manufacturing method according to the first embodiment.
Figure 6B:
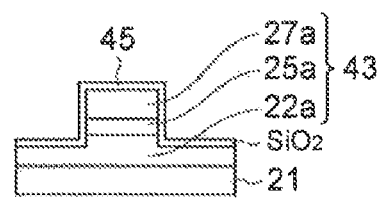
Figure 6C:
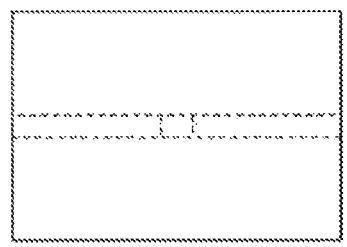
Figure 6D:
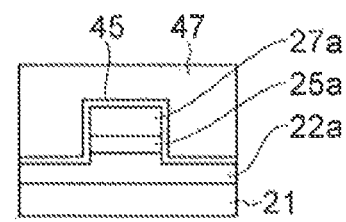
Figure 6E:
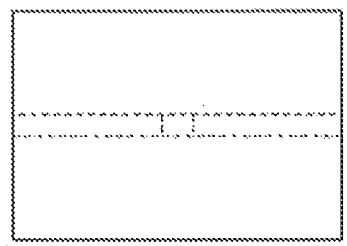
Figure 6F:
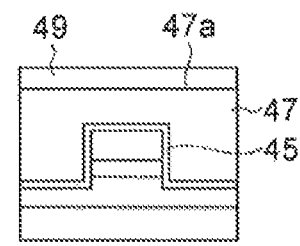

FIGS. 6A, 6C and 6E are plan views. FIGS. 6B, 6D and 6F are sectional views of FIGS. 6A, 6C and 6E, respectively. As an example, FIG. 6A is a plan view and FIG. 6B is a sectional view taken along the line II-II in FIG. 6A. The same applies to FIGS. 6C and 6E and to FIGS. 6D and 6F.

In this embodiment, the insulating layer 35 is formed as the protective layer covering the waveguide mesa 33. Thereafter, the dummy buried region 37 and the insulating layer 35 are etched through the resist mask 39a to form the insulating mask 41. Further, the second cladding layer of the semiconductor waveguide mesa 33 is etched through the insulating mask 41. Alternatively, the dummy buried region 37 may be formed directly on the waveguide mesa without the formation of the insulating layer 35, and the dummy buried region 37 may be etched through the resist mask 39a, thereby forming a mask composed of the dummy buried region 37. In this case, the second cladding layer of the semiconductor waveguide mesa 33 may be etched using the dummy buried region 37a as a mask which has an opening 37b corresponding to the opening 39b of the resist mask 39a. In this case too, the dummy buried region 37a covers the side surfaces and the top surfaces of the first portion 33a and the second portion 33b of the waveguide mesa 33, as well as covers the side surfaces of the third portion 33c of the waveguide mesa 33. Because the dummy buried region 37a has the opening 37b only on the top surface of the third portion 33c of the waveguide mesa 33, the first cladding layer 22a and the element-isolating mesa structure located under the core layer 25a of the waveguide mesa 33 are appropriately protected from etching.

Next, as illustrated in FIGS. 6A and 6B, an insulating layer 45 is formed on a top surface and a side surface of a waveguide mesa 43 which corresponds to the waveguide mesa 33. For example, the insulating layer 45 is made of a dielectric material such as $SiO_2$, SiON, or SiN. The waveguide mesa 43 includes a first portion 43a, a third portion 43c and a second portion 43b arranged sequentially along the direction of the waveguide axis.

After the insulating layer 45 is formed as the protective film, as illustrated in FIGS. 6C and 6D, a buried region 47 is formed on the side surfaces and the top surface of the waveguide mesa 43 as well as on the substrate 21. In the embodiment, the buried region 47 serves as a second buried region. In this embodiment, the buried region 47 is formed of, for example, a benzocyclobutene (BCB) resin. The thickness of the BCB resin is preferably not less than 2 μm on the waveguide mesa 43.

Next, the formation of p-side electrodes and n-side electrode will be described. As illustrated in FIGS. 6E and 6F, a resist 49 is formed on the flat surface 47a of the buried region 47. In this embodiment, openings for p-side electrodes are formed first.

Figure 7A:
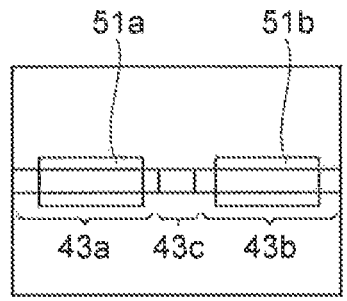
FIGS. 7A to 7H schematically illustrate primary steps in a Mach-Zehnder modulator manufacturing method and an insulated optical waveguide manufacturing method according to the first embodiment.
Figure 7B:
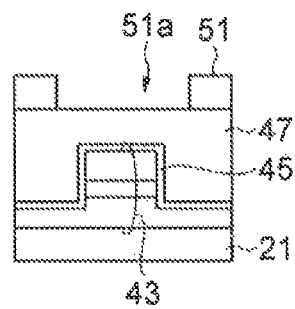

As illustrated in FIGS. 7A and 7B, the procedures described hereinabove are repeated to form a resist mask 51 having a perforated pattern for the formation of p-side electrodes. In this embodiment, the resist mask 51 has an opening 51a above the first portion 43a, and an opening 51b above the second portion 43b of the waveguide mesa 43. On the other hand, the resist mask 51 covers an area above the third portion 43c of the waveguide mesa 43.

Figure 7C:
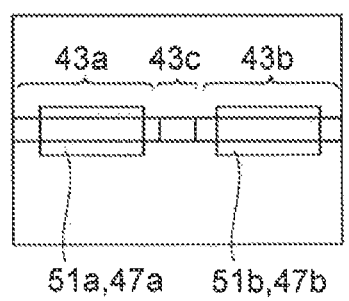
Figure 7D:
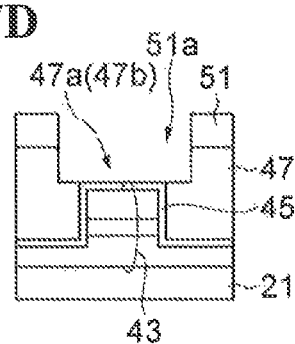

As illustrated in FIGS. 7C and 7D, the buried region 47 is etched through the resist mask 51 to form openings 47a and 47b in the buried region 47. In this embodiment, the BCB resin is etched by RIE with a mixed gas including $CF_4$ and $O_2$.

Figure 7E:
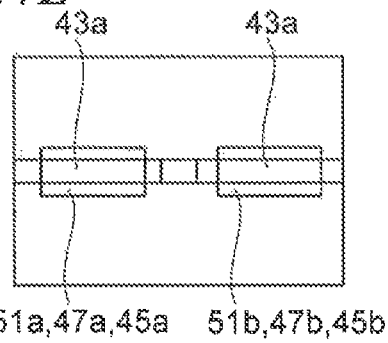
Figure 7F:
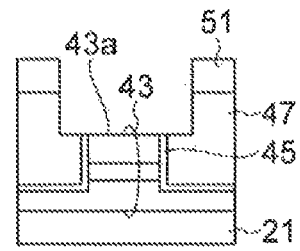
Figure 7G:
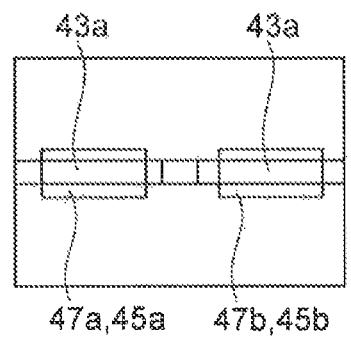
Figure 7H:
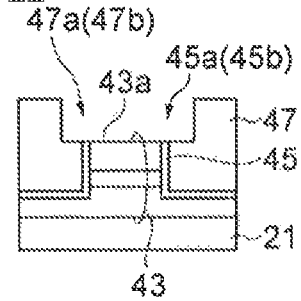

As illustrated in FIGS. 7E and 7F, the insulating layer 45 is etched through the resist mask 51 to form openings 45a and 45b in the insulating layer 45. In this embodiment, the insulating layer 45 formed of, for example, $SiO_2$ is etched by RIE with $CF_4$ gas. A top surface 43a of the waveguide mesa 43 is exposed through the openings 45a and 45b formed on the first portion 43a and the second portion 43b of the waveguide mesa 43, respectively. As illustrated in FIGS. 7G and 7H, the resist mask 51 is removed with an organic solvent, for example.

Next, an opening for the formation of n-side electrode is formed. As illustrated in FIGS. 8A and 8B, a resist 53 is formed on the surface 47a of the buried region 47 and on the top surface 43a of the waveguide mesa 43 through the openings 45a and 45b. As illustrated in FIGS. 8C and 8D, the procedures described hereinabove are repeated to form a resist mask 55 having a perforated pattern for the formation of n-side electrode. In this embodiment, the resist mask 55 covers the top surface extending from the first portion 43a to the second portion 43b of the waveguide mesa 43. Further, the resist mask 55 has an opening 55c on the element-isolating mesa structure connected to the waveguide mesa 43.

As illustrated in FIGS. 8E and 8F, the buried region 47 is etched through the resist mask 55 to form an opening 47c in the buried region 47. In this embodiment, the buried region 47 formed of, for example, a BCB resin is etched by RIE with a mixed gas including $CF_4$ and $O_2$.

Figure 9A:
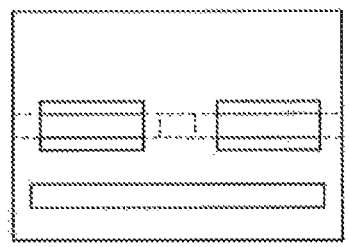
FIGS. 9A to 9I schematically illustrate primary steps in a Mach-Zehnder modulator manufacturing method and an insulated optical waveguide manufacturing method according to the first embodiment.
Figure 9B:
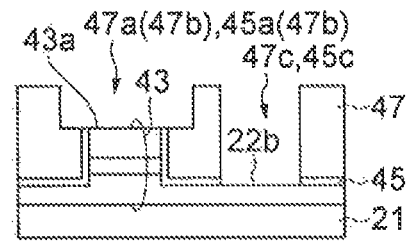

As illustrated in FIGS. 8G and 8H, the insulating layer 45 is etched through the resist mask 55 to form an opening 45c in the insulating layer 45. In this embodiment, the insulating layer 45 formed of, for example, $SiO_2$ is etched by RIE with CF$_4$ gas. A top surface 22b of the first cladding layer 22a of the element-isolating mesa structure is exposed through the opening 45c in the insulating layer 45. As illustrated in FIGS. 9A and 9B, the resist mask 55 is removed with an organic solvent, for example.

Figure 9C:
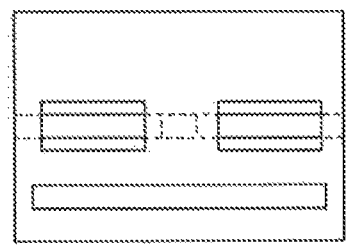
Figure 9D:
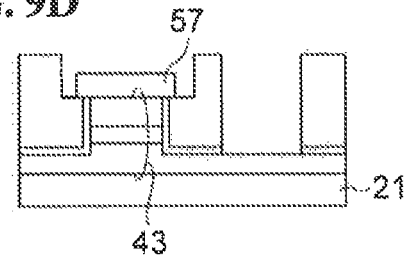

As illustrated in FIGS. 9C and 9D, p-side electrodes 57 are formed on the first portion and the second portion of the waveguide mesa 43. The p-side electrodes 57 are formed by, for example, depositing Ti/Pt/Au by a vacuum deposition method. In forming the p-side electrodes 57, a lift-off method is preferably used to obtain a patterned electrode. After forming the p-side electrodes 57, annealing is performed, for example, at 320° C. for 3 minutes in order to obtain good ohmic contact.

Figure 9E:
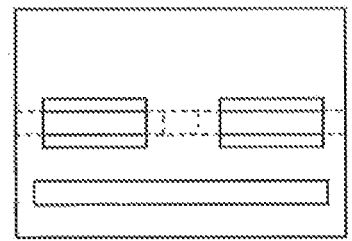
Figure 9F:
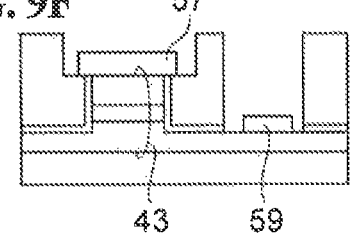

As illustrated in FIGS. 9E and 9F, an n-side electrode 59 is formed on the element-isolating mesa structure. The n-side electrode 59 is formed by, for example, depositing AuGeNi/Au by a vacuum deposition method. In forming the n-side electrode 59, a lift-off method is preferably used to obtain a patterned electrode. After forming the n-side electrode 59, annealing is performed, for example, at 300° C. for 3 minutes in order to obtain good ohmic contact.

Figure 9G:
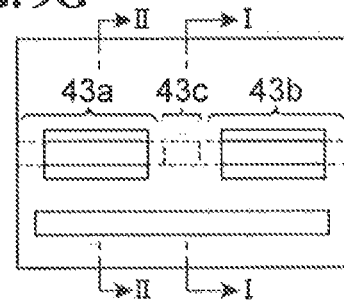
Figure 9H:
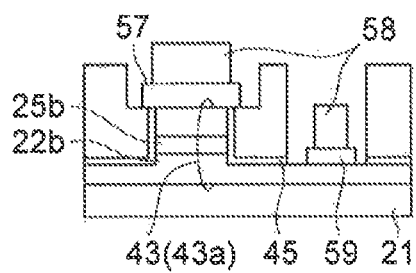
Figure 9I:
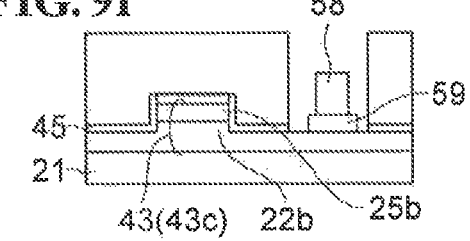

As illustrated in FIGS. 9G, 9H and 9I, plating layers are formed on the p-side and n-side electrodes, 57 and 59. Thereafter, the back surface of the substrate 21 is polished to reduce the thickness of the substrate to, for example, 100 μm. Through these steps described hereinabove, a Mach-Zehnder modulator 11 according to this embodiment is manufactured.

Second Embodiment

Next, a method for manufacturing a Mach-Zehnder modulator and a method for manufacturing an optical waveguide will be described with reference to FIGS. 10A to 10F and FIGS. 11A to 11H. While the first embodiment involves SOG in the dummy buried region, the SOG may be replaced by a hard-baked resist. The second embodiment utilizes a dummy buried region including a resist instead of the dummy buried region 37 in the first embodiment.

Figure 3I:
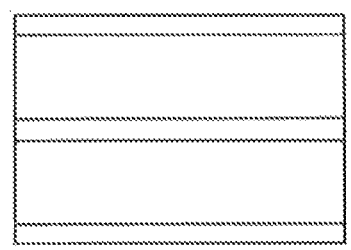
Figure 3J:
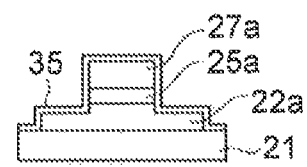

Next, steps for exposing the top surface of the waveguide mesa 33 will be described. In the first embodiment, after the element-isolating mesa structure is formed, the insulating mask 29a is removed as illustrated in FIGS. 3G and 3H, and the insulating layer 35 (such as SiON) is formed as the protective layer covering the waveguide mesa 33 as illustrated in FIGS. 3I and 3J. In the second embodiment, the formation of the insulating layer 35 is followed by the following steps. As illustrated in FIGS. 10A and 10B, a dummy buried region (also referred to as a masking buried region) 63 is formed on the waveguide mesa 33 covered with the insulating layer 35. In this embodiment, a first resist (referred to as resist 63) is applied for forming the dummy buried region 63. After the resist 63 is applied, as illustrated in FIGS. 10C and 10D, a portion of the resist 63 is removed by etching over the entire surface uniformly by an ashing process until the insulating layer 35 covering the top of the waveguide mesa 33 is exposed. Thereafter, the resist 63 is baked to form a cured resist 63a. For example, the baking treatment for the resist 63 is performed at 160° C. for 30 minutes. The cured resist 63a defines the dummy buried region. (Hereinafter, the cured resist 63a will be also referred to as the dummy buried region.)

Figure 11A:
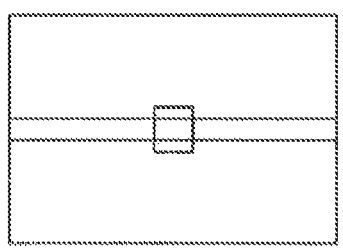
FIGS. 11A to 11H schematically illustrate primary steps in a Mach-Zehnder modulator manufacturing method and an insulated optical waveguide manufacturing method according to the second embodiment.
Figure 11B:
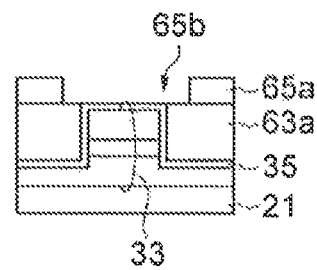

Next, as illustrated in FIGS. 10E and 10F, a second resist 65 is formed on the cured resist 63a. As illustrated in FIGS. 11A and 11B, the second resist 65 is exposed and developed through a photomask or a reticle, and then a patterned second resist 65a is formed. Because the cured resist 63a has been hard-baked, the shape of the cured resist 63a is not substantially changed during developing the second resist 65. The patterned second resist 65a has an opening 65b on the third portion of the waveguide mesa 33. The width of the opening 65b is larger than the width of the waveguide mesa 33. In the opening 65b of the patterned second resist 65a, the insulating layer 35 covering the top of the third portion of the waveguide mesa 33 is exposed.

Figure 11C:
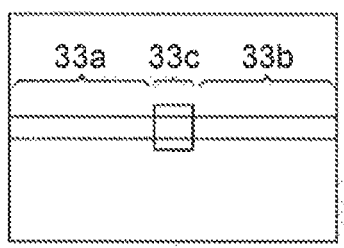
Figure 11D:
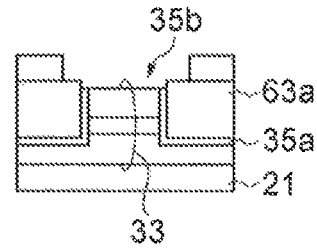

As illustrated in FIGS. 11C and 11D, the insulating layer 35 covering the top of the third portion 33c of the waveguide mesa 33 is etched using the patterned second resist 65a as a mask, thereby forming an insulating layer 35a. As a result of this etching of the insulating layer 35, the top of the third portion 33c of the waveguide mesa 33 is exposed.

Figure 11E:
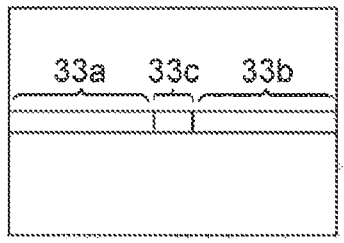
Figure 11F:
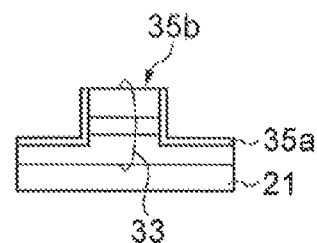

Except a portion of the waveguide mesa 33, the side surfaces and the top surface of the waveguide mesa 33 are covered with the insulating layer 35a. Specifically, the portion of the waveguide mesa 33 exposed from the insulating layer 35a is the top surface of the third portion 33c of the waveguide mesa 33 that is visible through the opening 65b of the patterned second resist 65a. After the top of the third portion 33c of the waveguide mesa 33 is exposed, as illustrated in FIGS. 11E and 11F, the patterned second resist 65a and the cured resist 63a are removed. Through these steps, an insulating mask 61 is formed. The patterned second resist 65a and the cured resist 63a are removed by washing with an organic solvent and oxygen (O$_2$) plasma ashing. In this embodiment, the insulating mask 61 includes the insulating layer 35a.

Figure 11G:
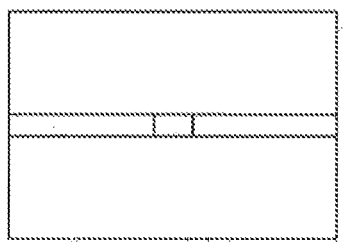
Figure 11H:
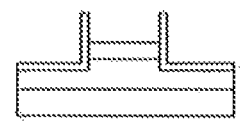

As illustrated in FIGS. 11G and 11H, the second cladding layer of the waveguide mesa 33 that is exposed in the opening 35b of the insulating layer 35a is etched through the insulating mask 61. As a result of this etching, the top of the core layer is exposed. In this embodiment, the insulating layer 35a constituting the insulating mask 61 is made of SiON. In this etching of the waveguide mesa 33, the insulating layer 35a has an opening only on the top surface of the third portion 33c of the waveguide mesa 33. Thus, the first cladding layer and the element-isolating mesa structure located under the core layer of the waveguide mesa 33 are not etched.

As already mentioned, in etching the waveguide mesa 33, a protrusion of the semiconductor layer may remain on the core layer along the interface between the waveguide mesa and the dielectric film of SiON (see FIG. 5E). Where necessary, the protrusion of the semiconductor layer is etched away with diluted hydrochloric acid after etching the waveguide mesa 33. In the etching of the waveguide mesa 33 through the insulating mask 61, the semiconductor layer that is exposed in the third portion of the waveguide mesa 33 is the core layer (MQW composed of AlGaInAs/AlInAs). These materials constituting the core layer are negligibly etched with diluted hydrochloric acid. Thus, the protrusion of the semiconductor layer is etched away with diluted hydrochloric acid while the core layer exposed in the third portion of the waveguide mesa 33 is not substantially etched. After etching the semiconductor layer (second cladding layer) in the third portion of the waveguide mesa 33, the insulating mask 61 is removed (see FIGS. 5G and 5H). Because the cured resist 63a defining the dummy buried region has been removed in this embodiment, the insulating layer 35a is removed in the step of removing the insulating mask 61. When the insulating layer 35a is made of SiON, the insulating layer 35a is etched with, for example, hydrofluoric acid (such as BHF). As a result of this etching, the second cladding layer defines the uppermost surface in the first portion 43a and the second portion 43b of the waveguide mesa 43 (see FIG. 6A), and the core layer defines the uppermost surface in the third portion 43c of the waveguide mesa 43. That is, the i-type core layer is exposed as the top surface in the third portion 43c of the waveguide mesa 43. Thus, the second cladding layer in the first portion 43a of the waveguide mesa 43 is physically and electrically isolated from the second cladding layer in the second portion 43b.

The formation of a buried region to bury the waveguide mesa and the subsequent steps are performed in the same manner as in the first embodiment.

Third Embodiment

A method for manufacturing a Mach-Zehnder modulator and a method for manufacturing an optical waveguide will be described with reference to FIGS. 12A to 12F and FIGS. 13A to 13H. The first embodiment involves SOG in the dummy buried region 37, and the second embodiment involves the cured resist 63a as the dummy buried region 63. In the third embodiment, an insulating layer may be used instead of the SOG or the cured resist. The third embodiment involves a dummy buried region (also referred to as a masking buried region) 71 instead of the dummy buried region 37 in the first embodiment or the dummy buried region 63 in the second embodiment.

Figure 12A:
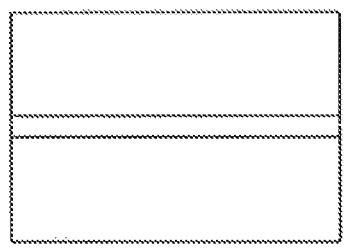
FIGS. 12A to 12F schematically illustrate primary steps in a Mach-Zehnder modulator manufacturing method and an insulated optical waveguide manufacturing method according to a third embodiment.
Figure 12B:
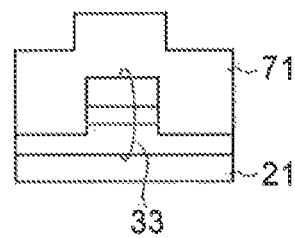

In this embodiment, after the element-isolating mesa structure is formed, the insulating mask 29a is removed as illustrated in FIGS. 3G and 3H. In this embodiment, the insulating layer 35 is not provided. As illustrated in FIGS. 12A and 12B, a silicon dioxide film ($SiO_2$ film) 71 is formed so as to bury the waveguide mesa 33. The silicon dioxide film is formed by the following method. For example, an organic silane compound such as tetraethylorthosilicate (TEOS) is applied by a spin coating method with a thickness larger than the height of the waveguide mesa 33, and is thereafter heated with, for example, a hot plate to form a silicon dioxide film 71. Alternatively, the silicon dioxide film may be formed by a CVD method using TEOS and oxygen as raw material gases. The use of TEOS as a raw material facilitates the formation of the silicon dioxide film with a large thickness. The silicon dioxide film 71 is formed over the waveguide mesa 33 in conformity to the shape of the waveguide mesa 33.

Figure 12C:
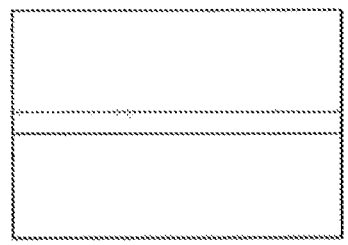
Figure 12D:
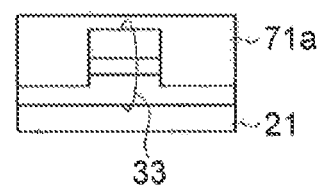

Next, as illustrated in FIGS. 12C and 12D, the surface of the silicon dioxide film 71 is planarized. For example, the planarization is performed by a chemical mechanical polishing (CMP) method. The chemical mechanical polishing is terminated before the top surface of the waveguide mesa 33 is exposed, thus forming a planarized silicon dioxide film 71a. The silicon dioxide film 71a defines a dummy waveguide region.

Figure 12E:
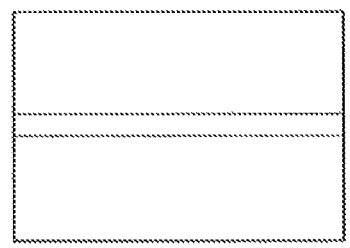
Figure 12F:
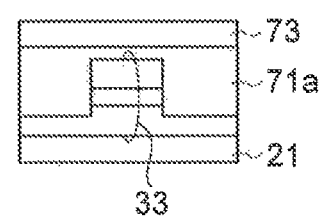
Figure 13A:
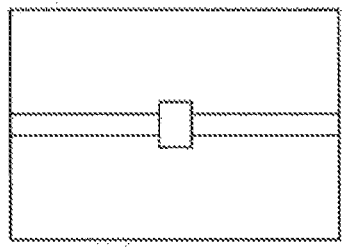
FIGS. 13A to 13H schematically illustrate primary steps in a Mach-Zehnder modulator manufacturing method and an insulated optical waveguide manufacturing method according to the third embodiment.
Figure 13B:
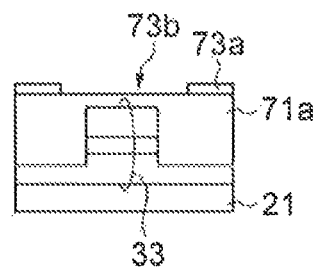

As illustrated in FIGS. 12E and 12F, a resist 73 is formed on a surface 71b of the planarized silicon dioxide film 71a. Next, the resist 73 is treated by a conventional photolithography method to form a pattern for the formation of an opening on the top surface of the waveguide mesa 33. Consequently, as illustrated in FIGS. 13A and 13B, a resist mask 73a is formed. The resist mask 73a has an opening 73b above the top surface of the waveguide mesa 33. The width of the opening 73b is larger than the width of the waveguide mesa 33. The waveguide mesa 33 is buried with the dummy buried region or the masking buried region. With this configuration, the thickness of the resist 73 may be reduced. Consequently, the resist mask 73a with highly accurate pattern is formed.

Figure 13C:
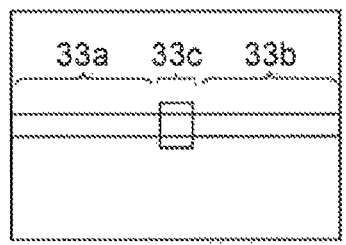
Figure 13D:
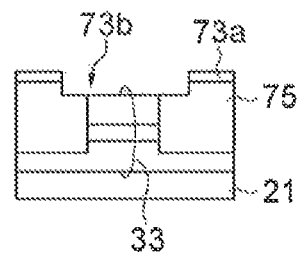
Figure 13E:
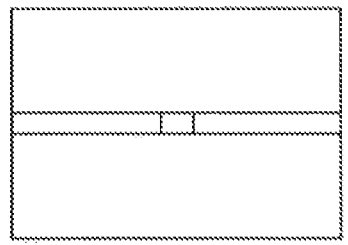
Figure 13F:
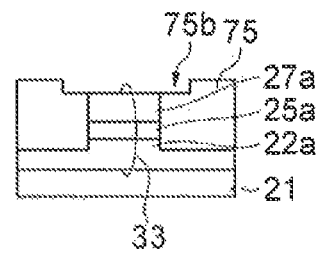

The planarized silicon dioxide film 71a is etched through the resist mask 73a. By this etching process, an insulating mask 75 (the etched silicon dioxide film) is formed as illustrated in FIGS. 13C and 13D. The insulating mask 75 has an opening 75a corresponding to the position of the waveguide mesa 33. The top surface of the waveguide mesa 33 is exposed in the opening 75a of the insulating mask 75. The side surfaces of the waveguide mesa 33 are covered with the insulating mask 75. The silicon dioxide film 71a is etched by dry etching (RIE) with $CF_4$ gas. After the insulating mask 75 is formed, as illustrated in FIGS. 13E and 13F, the resist mask 73a is removed by washing with an organic solvent and oxygen ($O_2$) plasma ashing.

Figure 13G:
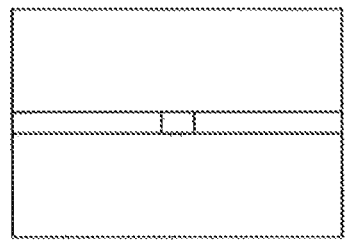
Figure 13H:
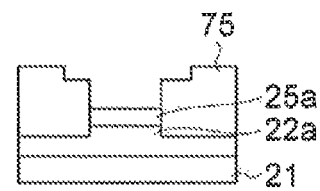

As illustrated in FIGS. 13G and 13H, the uppermost semiconductor layer (the second cladding layer) in the waveguide mesa 33 is etched by, for example, a dry etching process through the insulating mask 75. As a result of this etching, the core layer in the third portion of the waveguide mesa 33 is exposed. Because the insulating mask 75 has an opening only on the top surface of the third portion of the waveguide mesa 33, the layers located under the core layer of the waveguide mesa are not etched. In etching of the waveguide mesa 33, a protrusion of the semiconductor layer may remain on the side surfaces of the insulating mask 75 (the dummy buried region or the masking buried region). The protrusion of the semiconductor layer is removed by etching with diluted hydrochloric acid after the second cladding layer on the core layer is etched away. The uppermost layer in the waveguide mesa that is exposed by the etching of the second cladding layer is the core layer (MQW composed of AlGaInAs/AlInAs). These materials constituting the core layer are negligibly etched with diluted hydrochloric acid. Thus, the protrusion of the semiconductor layer is etched away with diluted hydrochloric acid while the core layer exposed in the third portion of the waveguide mesa 33 is not substantially etched. By etching the semiconductor layer (the second cladding layer) in the third portion of the waveguide mesa 33, an isolation region is formed between the first portion and the second portion of the waveguide mesa 33. Thereafter, the insulating mask 75 (the dummy buried region or the masking buried region) is removed by etching with, for example, hydrofluoric acid (such as BHF). As a result of the etching, the second cladding layer defines the uppermost surface in the first portion 43a and the second portion 43b of the waveguide mesa 43 as illustrated in FIGS. 6A and 6B, and the core layer defines the uppermost surface in the third portion 43c of the waveguide mesa 43. Because the i-type core layer is exposed as the top surface in the third portion 43c of the waveguide mesa 43, the second cladding layer in the first portion 43a of the waveguide mesa 43 is isolated from the second cladding layer in the second portion 43b.

The formation of a buried region to bury the waveguide mesa and the subsequent steps are performed in the same manner as in the first embodiment.

According to the aforementioned manufacturing method, the dummy buried region 71 is formed on the waveguide mesa 33. Further, an opening is formed in the dummy buried region 71a on the top surface of the third portion 33c of the waveguide mesa 33 with use of the mask 73a having an opening on the third portion 33c of the waveguide mesa 33, thereby fabricating the insulating mask 75 including the dummy buried region 71a. During the fabrication of the insulating mask 75, the side surfaces of the third portion 33c of the waveguide mesa 33 are covered with the insulating mask 75. Thus, the side surfaces of the third portion 33c of the waveguide mesa 33 are protected by the insulating mask 75. Further, the dummy buried region 71a on the top surface of the third portion 33c of the waveguide mesa 33 is selectively etched. By the use of the insulating mask 75 fabricated in this manner, the second conductivity type semiconductor layer (the second cladding layer) 27a in the third portion 33c of the waveguide mesa 33 is selectively etched. During this etching, the first conductivity type semiconductor layer (the first cladding layer) 23a is covered with the dummy buried region 71a.

The first conductivity type semiconductor layer (the first cladding layer) 23a is thus not etched. Through these steps, a waveguide mesa having an isolation region is manufactured.

Referring back to FIG. 1, waveguide devices having an isolation region manufactured in the first embodiment, the second embodiment and the third embodiment is described. FIG. 1 illustrates a Mach-Zehnder modulator as an example of the waveguide devices having the isolation region. The waveguide device having the isolation region includes waveguide mesas (waveguide mesas 43) that have a first portion 13a (14a), a third portion 13c (14c) and a second portion 13b (14b) arranged along the direction of the waveguide axis. The third portion 13c (14c) is disposed between the first portion 13a (14a) and the second portion 13b (14b). The first portion 13a (14a) and the second portion 13b (14b) of the waveguide mesa 43 include a first conductivity type semiconductor layer, a core layer and a second conductivity type semiconductor layer stacked sequentially on the substrate. The third portion 13c (14c) of the waveguide mesa 43 includes the first conductivity type semiconductor layer and the core layer stacked sequentially on the substrate. The side surfaces of the first conductivity type semiconductor layer and the side surfaces of the core layer in the waveguide mesa 43 extend continuously in the direction of the waveguide axis from the first portion 13a (14a) to the second portion 13b (14b) of the waveguide mesa 43 via the third portion 13c (14c).

According to the manufacturing methods in the first embodiment, the second embodiment and the third embodiment, an opening is formed in the dummy buried region (the masking buried region) 37, 63, or 71a on the top surface of the third portion 33c of the waveguide mesa 33 with use of the resist mask 39a, 65a, or 73a. While using the resist mask 39a, 65a, or 73a, an opening is formed in the insulating layer 35 or 71a on the top surface of the third portion 33c of the waveguide mesa 33. The insulating layer and dummy buried region (the masking buried region) having the opening constitute the insulating mask 41. During the fabrication of the insulating mask 41, the dummy buried region (the masking buried region) 37, 63, or 71a covers the side surfaces of the first portion 33a and the second portion 33b of the waveguide mesa 33 as well as covers the side surfaces of the third portion 33c of the waveguide mesa 33. With this configuration, the side surfaces of the third portion 33c of the waveguide mesa 33 can be protected by the dummy buried region or the masking buried region when an opening is formed in the dummy buried region (the masking buried region). Further, the above configuration allows for selective etching of the insulating layer 35, 71a on the top surface of the third portion 33c of the waveguide mesa 33. By using the insulating mask 41, the second conductivity type semiconductor layer 27a in the third portion 33c of the waveguide mesa 33 is etched selectively. During this etching, the first conductivity type semiconductor layer 22a is not exposed to the etchant. Through these steps, the waveguide mesa 43 having an isolation region in the third portion 43c is manufactured.

Referring back to FIG. 1 and FIGS. 9G, 9H and 9I, the waveguide mesa 43 (13) having an isolation region will be described. The waveguide mesa 43 (13) includes a first portion 43a (13a), a third portion 43c (13c) and a second portion 43b (13b) arranged along the direction of the waveguide axis. The first portion 43a (13a) and the second portion 43b (13b) of the waveguide mesa 43 (13) include a first conductivity type semiconductor layer 22a, a core layer 25a and a second conductivity type semiconductor layer 27a stacked sequentially on the substrate 21. The third portion 43c (13c) of the waveguide mesa 43 (13) includes the first conductivity type semiconductor layer 22a and the core layer 25a stacked sequentially on the substrate 21. In the first portion 43a (13a) and the second portion 43b (13b) of the waveguide mesa 43 (13), the second conductivity type semiconductor layer 27a is isolated from each other by forming the third portion 43c (13c) between the first portion 43a (13a) and the second portion 43b (13b). The third portion 43c (13c) serves as the isolation region. The side surfaces (22b in FIG. 9) of the first conductivity type semiconductor layer 22a and the side surfaces (25b in FIG. 9) of the core layer 25a in the waveguide mesa 43 (13) extend continuously in the direction of the waveguide axis from the first portion 43a (13a) to the second portion 43b (13b) of the waveguide mesa 43 (13) via the third portion 43c (13c).

Specifically, in the embodiment, the side surfaces 22b of the first conductivity type semiconductor layer 22a in the third portion 43c (13c) of the waveguide mesa 43 (13) do not have a substantial change in elevation at the boundary between the first conductivity type semiconductor layer 22a and the core layer 25a, and are connected continuously to the side surfaces 25b of the i-type core layer 25a in the third portion 43c (13c) of the waveguide mesa 43 (13). The side surfaces 22b of the first conductivity type semiconductor layer 22a do not have any elevation changes in the vicinity of the boundary between the first portion 43a and the third portion 43c of the waveguide mesa 43 as well as in the vicinity of the boundary between the second portion 43b and the third portion 43c of the waveguide mesa 43.

Figure 14:
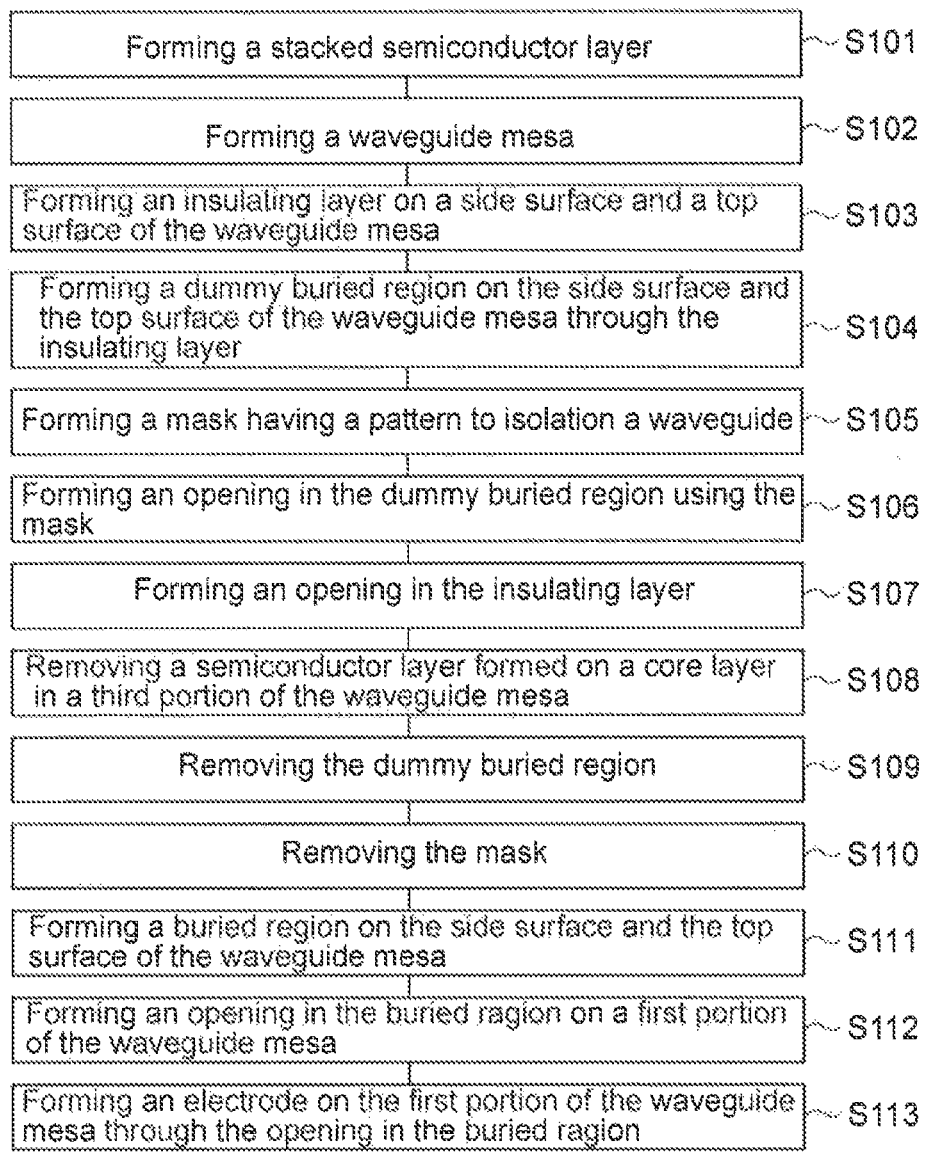
FIG. 14 is a diagram illustrating primary steps in a Mach-Zehnder modulator manufacturing method and an insulated optical waveguide manufacturing method.

The method for manufacturing the Mach-Zehnder modulator and the method for manufacturing the optical waveguide having the isolation region will be further described below. FIG. 14 is a diagram illustrating primary steps in the method for manufacturing the Mach-Zehnder modulator and the method for manufacturing the optical waveguide having the isolation region. Where possible, the reference signs used in the aforementioned embodiments will be used in the description of FIG. 14 to facilitate understanding of the invention.

The method for manufacturing a Mach-Zehnder modulator 11 includes a step S101 in which a stacked semiconductor layer 20 including a first conductivity type semiconductor layer 23, a core layer 25 and a second conductivity type semiconductor layer 27 is formed on a substrate 21. The core layer 25 includes an i-type (non-doped) semiconductor layer. In a step S102, a waveguide mesa 33 which extends in a direction of a waveguide axis is formed by etching the stacked semiconductor layer 20 using a stripe-shaped mask. The waveguide mesa 33 includes a first portion 33a, a second portion 33b and a third portion 33c. The first portion 33a, the third portion 33c and the second portion 33b are arranged sequentially along the direction of the waveguide axis. In a step S103, an insulating layer 35 is formed on the substrate 21 so as to cover the top surface and the side surfaces of the waveguide mesa 33. After the insulating layer 35 is formed, a step S104 is performed in which a dummy buried region 37 or 63 is formed to bury the top surface and the side surfaces of the waveguide mesa 33. In a step S105, a mask 39a or 65a is formed on the dummy buried region 37 or 63. The mask has an opening on the third portion 33c of the waveguide mesa 33. The dummy buried region 37 or 63 is made of a different material from the insulating layer 35. In a step S106, the dummy buried region 37 or 63 is etched through the mask 39a or 65a to form an opening 37b or 63b. Through the opening 37b or 63b, the insulating layer 35 on the third portion 33c of the waveguide mesa 33 is exposed. After the opening is formed in the dummy buried region 37 or 63, a step S107 is performed in which an opening 35b is formed in the insulating layer 35 on the top surface of the third portion 33c of the waveguide mesa 33 with the use of the mask 39a or 65a. Consequently, the insulating layer 35 defines an insulating mask 35a. The insulating mask 35a covers the top surface and the side surfaces of the first portion 33a as well as the top surface and the side surfaces of the second portion 33b of the waveguide mesa 33. During the fabrication of the insulating mask 35a from the insulating layer 35, the dummy buried region 37a or 63a covers the side surfaces of the third portion 33c of the waveguide mesa 33. In a step S108, after the mask 39a or 65a is removed, the second conductivity type semiconductor layer 27a in the third portion 33c of the waveguide mesa 33 is etched through the insulating mask 35a. Through this step S108, the second conductivity type semiconductor layer 27a is removed. Next, the dummy buried region 37a or 63a is removed in a step S109. Where necessary, the dummy buried region 37a or 63a may be removed after removing the residue of the second conductivity type semiconductor layer 27a. Alternatively, as required, the dummy buried region 37a or 63a may be removed before etching the second conductivity type semiconductor layer 27a in the third portion 43c of the waveguide mesa 43. After etching the second conductivity type semiconductor layer 27a, a step S110 is performed in which the insulating mask 35a is removed.

After the insulating mask 35a is removed, an insulating layer 45 is formed in a step S111 so as to cover the surface of the waveguide mesa 33. After forming the insulating layer 45, further, a buried region 47 is formed which buries the waveguide mesa 33. In a step S112, the insulating layer 45 and the buried region 47 are processed to form a first electrode opening 47a therein. As a result, the top surface of the first portion 43a of the waveguide mesa 43 is exposed through the first electrode opening 47a. After the first electrode opening 47a is formed in the buried region 47, a step S113 is performed in which a first electrode 57 is formed in the first electrode opening 47a so as to be electrically connected to the top surface of the first portion 43a of the waveguide mesa 43. In forming the first electrode opening 47a in the insulating layer 45 and the buried region 47, a second electrode opening 47b may be formed in the insulating layer 45 and the buried region 47. The top surface of the second portion 43b of the waveguide mesa 43 is exposed through the second electrode opening 47b. Further, in forming the first electrode 57, a second electrode 57 may be formed in the second electrode opening 47b. The second electrode 57 is connected to the top surface of the second portion 43b of the waveguide mesa 43 via the second electrode opening 47b. According to this manufacturing method, the second electrode 57 is electrically isolated from the first electrode 57 because the isolation structure is formed in the waveguide mesa 43. Specifically, the third portion 43c constituting the isolation structure is formed between the first portion 43a and the second portion 43b. The first portion 43a and the second portion 43b are physically and electrically isolated from each other.

In the first embodiment, preferably, the dummy buried region is made of SOG and the insulating layer 35 is an insulating layer made of a dielectric material such as $SiO_2$, SiN or SiON. By using SOG as the material of the dummy buried region, the dummy buried region may be easily removed after the waveguide mesa burying step and the semiconductor etching step. In the first embodiment, the dummy buried region is removed after etching the second conductivity type semiconductor layer 27a in the third portion 43c of the waveguide mesa 43.

Preferably, in the step S105 (in which the dummy buried region is formed), a resist is applied to form the dummy buried region and the resist is then hard baked. That is, the dummy buried region is preferably composed of the cured resist. By being hard baked, the resist becomes resistant to the developer used in the patterning of the resist mask. When the dummy buried region is composed of the cured resist, the cured resist may be removed while ensuring that the semiconductors and the insulating mask will not be damaged. In the second embodiment, the dummy buried region is removed before etching the second conductivity type semiconductor layer 27a in the third portion 43c of the waveguide mesa 43.

Figure 15:
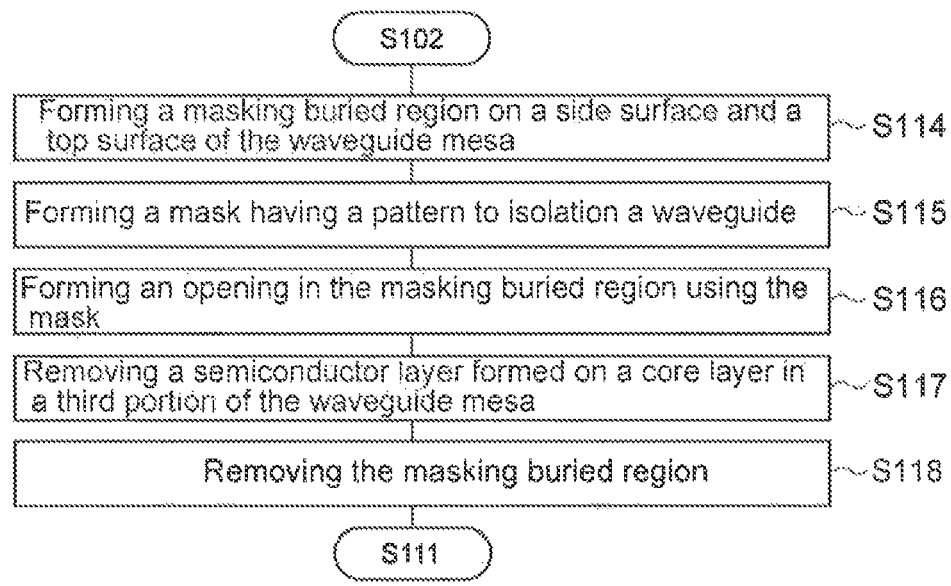
FIG. 15 is a diagram illustrating primary steps in a Mach-Zehnder modulator manufacturing method and an insulated optical waveguide manufacturing method.

Further, FIG. 15 shows a diagram illustrating primary steps in the method for manufacturing the Mach-Zehnder modulator and the method for manufacturing the optical waveguide having the isolation region. Where possible, the reference signs used in the aforementioned embodiments will be used in the description of FIG. 15 to facilitate understanding of the invention.

After the step of forming the waveguide mesa 33 from the stacked semiconductor layer 20 (the step S102) in FIG. 14, a step S114 is performed in which a masking buried region (for example, a dummy buried region 37, 63a, or 71a) is formed so as to bury the top surface and the side surfaces of the waveguide mesa 33. For forming the masking buried region 37 or 63a, an insulating layer 35 is formed. Here, the insulating layer 35 is in contact with the top surface and the side surfaces of the waveguide mesa 33. Further, the dummy buried region 37 or 63a is in contact with the top surface and the side surfaces of the insulating layer 35 on the waveguide mesa 33. Alternatively, the masking buried region (the dummy buried region 71a) may be formed without the formation of the insulating layer 35. In this case, the masking buried region is in contact with the top surface and the side surfaces of the waveguide mesa 33. In the embodiment, the masking buried region constitutes the insulating mask 75 which serves as an etching mask. The following description will use the reference signs in the second embodiment. In a step S115, a mask 73a is formed. The mask 73a is disposed on the waveguide mesa 33, and has an opening on the third portion 33c of the waveguide mesa 33. In a step S16, an opening is formed in the masking buried region on the third portion 33c of the waveguide mesa 33 with the use of the mask 73a, and consequently the masking buried region defines an insulating mask 75. In forming the insulating mask 75 from the masking buried region, the dummy buried region 71a covers the side surfaces of the third portion 33c of the waveguide mesa 33. In a step S117, the mask 73a is removed, and thereafter the second conductivity type semiconductor layer 27a in the third portion 33c of the waveguide mesa 33 is etched using the insulating mask 75 as an etching mask. The insulating mask 75 covers the side surfaces of the third portion 33c of the waveguide mesa 33. After etching the second conductivity type semiconductor layer 27a, the step S118 is performed in which the masking buried region (insulating mask 75) is removed. After removing the insulating mask 75, the step S111 and the subsequent steps are performed.

The dummy buried region 71a includes silicon dioxide. In forming the dummy buried region 71a so as to bury the top surface and the side surfaces of the waveguide mesa 33, a silicon dioxide layer 71 is formed on the top surface and the side surfaces of the waveguide mesa 33. The surface of this silicon dioxide layer 71 is planarized to form the dummy buried region 71a. After the dummy buried region 71a is formed, an opening is formed in the dummy buried region 71a on the third portion 33c of the waveguide mesa 33. In forming the opening in the dummy buried region 71a, the side surfaces of the first conductivity type semiconductor layer 22a in the third portion 33c of the waveguide mesa 33 are protected.

The scope of the present invention is not limited to the specific configurations disclosed in the aforementioned embodiments.

What is claimed is:

1. A method for manufacturing a Mach-Zehnder modulator comprising the steps of:
   forming a stacked semiconductor layer on a substrate, the stacked semiconductor layer including a first conductivity type semiconductor layer, a core layer and a second conductivity type semiconductor layer;
   forming a waveguide mesa by etching the stacked semiconductor layer, the waveguide mesa having a first portion, a second portion and a third portion arranged between the first and second portions, the waveguide mesa extending in a direction of a waveguide axis;
   forming a first buried region on a top surface and a side surface of the waveguide mesa and on the substrate;
   forming a mask on the first buried region, the mask having an opening on the third portion of the waveguide mesa;
   forming an opening in the first buried region by etching the first buried region using the mask to expose a top surface of the third portion of the waveguide mesa through the opening in the first buried region;
   after removing the mask, etching the second conductivity type semiconductor layer in the third portion of the waveguide mesa through the first buried region as a mask; and
   removing the first buried region after etching the second conductivity type semiconductor layer,
   wherein, in the step of forming the opening in the first buried region, the first buried region covers a side surface of the third portion of the waveguide mesa.

2. The method for manufacturing a Mach-Zehnder modulator according to claim 1, further comprising the steps of:
   after forming the waveguide mesa, forming an insulating layer on the top surface and the side surface of the waveguide mesa and on the substrate; and
   after forming the opening in the first buried region, forming an opening in the insulating layer on the third portion of the waveguide mesa by etching the insulating layer through the mask to form an insulating mask from the insulating layer,
   wherein the second conductivity type semiconductor layer is etched through the insulating mask after removing the mask,
   in the step of forming the insulating mask, the first buried region covers the side surface of the third portion of the waveguide mesa, and
   the first buried region is made of a material different from a material of the insulating layer.

3. The method for manufacturing a Mach-Zehnder modulator according to claim 1, further comprising the steps of:
   after removing the first buried region, forming a second buried region on the top surface and the side surface of the waveguide mesa and on the substrate;
   forming a first electrode opening in the second buried region on the first portion of the waveguide mesa;
   forming a second electrode opening in the second buried region on the second portion of the waveguide mesa;
   forming a first electrode in the first electrode opening, the first electrode being electrically connected to a top surface of the first portion of the waveguide mesa through the first electrode opening; and
   forming a second electrode in the second electrode opening, the second electrode being electrically connected to a top surface of the second portion of the waveguide mesa through the second electrode opening.

4. The method for manufacturing a Mach-Zehnder modulator according to claim 1, wherein the first buried region is made of spin-on-glass;
   the mask is made of resist; and
   the opening of the mask has a width larger than a width of the third portion of the waveguide mesa.

5. The method for manufacturing a Mach-Zehnder modulator according to claim 1, wherein the step of forming the first buried region includes a step of applying a resist onto the top surface and the side surface of the waveguide mesa, and a step of baking the resist to form a cured resist,
   the first buried region includes the cured resist,
   the mask is made of resist, and
   the opening of the mask has a width larger than a width of the third portion of the waveguide mesa.

6. A method for manufacturing a Mach-Zehnder modulator comprising the steps of:
   forming a stacked semiconductor layer on a substrate, the stacked semiconductor layer including a first conductivity type semiconductor layer, a core layer and a second conductivity type semiconductor layer;
   forming a waveguide mesa by etching the stacked semiconductor layer, the waveguide mesa having a first portion, a second portion and a third portion arranged between the first and second portions, the waveguide mesa extending in a direction of a waveguide axis;
   forming a first buried region on a top surface and a side surface of the waveguide mesa and on the substrate, the first buried region including an insulating layer made of a dielectric material;
   forming a mask on the first buried region, the mask having an opening on the third portion of the waveguide mesa;
   forming an insulating mask by etching the first buried region using the mask, the insulating mask having an opening on the third portion of the waveguide mesa;
   after removing the mask, etching the second conductivity type semiconductor layer in the third portion of the waveguide mesa through the insulating mask; and
   removing the insulating mask after the etching the second conductivity type semiconductor layer,
   wherein, in the step of forming an insulating mask, the first buried region covers a side surface of the third portion of the waveguide mesa, and
   in the step of etching the second conductivity type semiconductor layer, the insulating mask covers the side surface of the third portion of the waveguide mesa.

7. The method for manufacturing a Mach-Zehnder modulator according to claim 6, wherein the insulating layer includes a silicon dioxide film; and
   the step of forming the first buried region includes a step of forming the silicon dioxide film on the top surface and the side surface of the waveguide mesa and on the substrate and a step of planarizing the silicon dioxide film.

8. A method for manufacturing an optical waveguide comprising the steps of:
   forming stacked semiconductor layers on a substrate, the stacked semiconductor layers including a first conductivity type semiconductor layer, a core layer and a second conductivity type semiconductor layer;
   forming a waveguide mesa by etching the stacked semiconductor layer, the waveguide mesa having a first portion, a second portion and a third portion arranged between the first and second portions, the waveguide mesa extending in a direction of a waveguide axis;
   forming an insulating layer on the top surface and the side surface of the waveguide mesa and on the substrate;

forming a first buried region on the insulating layer formed on the top surface and the side surface of the waveguide mesa and on the substrate, the first buried region including a material different from a material of the insulating layer;

forming a mask on the first buried region, the mask having an opening on the third portion of the waveguide mesa;

forming an insulating mask by etching the first buried region and the insulating layer using the mask, the insulating mask having an opening on the third portion of the waveguide mesa;

after removing the mask, etching the second conductivity type semiconductor layer in the third portion of the waveguide mesa through the insulating mask; and removing the insulating mask after etching the second conductivity type semiconductor layer, wherein, in the step of forming the insulating mask, the first buried region covers a side surface of the third portion of the waveguide mesa, and in the step of etching the second conductivity type semiconductor layer, the insulating mask covers the side surface of the third portion of the waveguide mesa.

* * * * *